United States Patent
Lee et al.

(10) Patent No.: US 9,852,923 B2
(45) Date of Patent: Dec. 26, 2017

(54) MASK ETCH FOR PATTERNING

(71) Applicant: Applied Materials Inc., Santa Clara, CA (US)

(72) Inventors: Gene Lee, San Jose, CA (US); Lucy Chen, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/677,890

(22) Filed: Apr. 2, 2015

(65) Prior Publication Data

US 2016/0293441 A1    Oct. 6, 2016

(51) Int. Cl.

| H01L 21/311 | (2006.01) |
|---|---|
| C23C 16/50 | (2006.01) |
| C23C 16/52 | (2006.01) |
| H01L 21/02 | (2006.01) |
| H01L 21/67 | (2006.01) |
| H01L 21/033 | (2006.01) |
| H01L 27/1157 | (2017.01) |
| H01L 27/11575 | (2017.01) |
| H01L 27/11582 | (2017.01) |

(52) U.S. Cl.
CPC ........ *H01L 21/31133* (2013.01); *C23C 16/50* (2013.01); *C23C 16/52* (2013.01); *H01L 21/02274* (2013.01); *H01L 21/0332* (2013.01); *H01L 21/31116* (2013.01); *H01L 21/31122* (2013.01); *H01L 21/31144* (2013.01); *H01L 21/67069* (2013.01); *H01L 27/1157* (2013.01); *H01L 27/11575* (2013.01); *H01L 27/11582* (2013.01)

(58) Field of Classification Search
CPC ......... H01L 21/31133; H01L 21/02274; H01L 21/67069; C23C 16/50; C23C 16/52
See application file for complete search history.

(56) References Cited

U.S. PATENT DOCUMENTS

| 2003/0207581 | A1 | 11/2003 | Becker et al. |
|---|---|---|---|
| 2013/0029484 | A1 | 1/2013 | Shimizu et al. |
| 2014/0213059 | A1* | 7/2014 | Doan ............... H01L 21/31138 438/694 |
| 2015/0064914 | A1 | 3/2015 | Kong et al. |

(Continued)

FOREIGN PATENT DOCUMENTS

JP    2001-210627 A    8/2001

OTHER PUBLICATIONS

Derwent 2013-W47896, Tsukamoto et al.*

(Continued)

*Primary Examiner* — Duy Vu N Deo
(74) *Attorney, Agent, or Firm* — Schwabe, Williamson & Wyatt, P.C.

(57) ABSTRACT

A hard mask layer is deposited on a feature layer over a substrate. The hard mask layer comprises an organic mask layer. An opening in the organic mask layer is formed using a first gas comprising a halogen element at a first temperature greater than a room temperature to expose a portion of the feature layer. In one embodiment, a gas comprising a halogen element is supplied to a chamber. An organic mask layer on an insulating layer over a substrate is etched using the halogen element at a first temperature to form an opening to expose a portion of the insulating layer.

12 Claims, 13 Drawing Sheets

(56) References Cited

U.S. PATENT DOCUMENTS

2015/0087154 A1     3/2015  Guha et al.
2015/0099366 A1*    4/2015  Takeda .............. H01L 21/67069
                                                          438/710

OTHER PUBLICATIONS

WO 2013/180179A1, Tsukamoto et al.*
PCT International Search Report and Written Opinion for PCT/US2016/014366, dated Apr. 29, 2016, (12 pages).

* cited by examiner

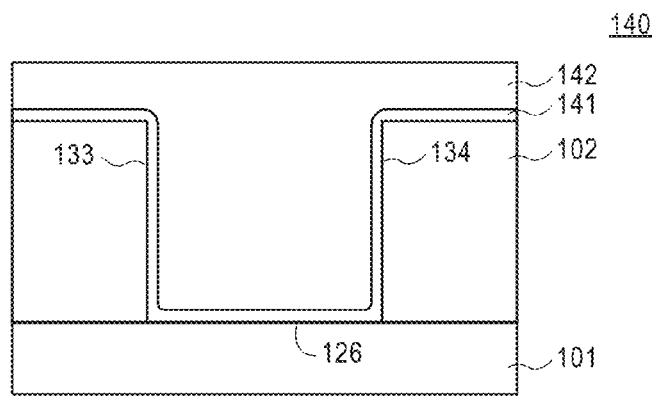
FIG. 1E
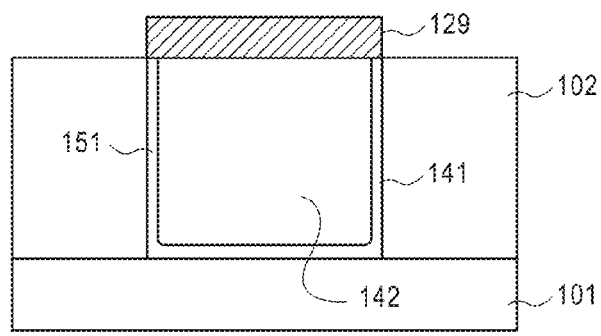
FIG. 1F
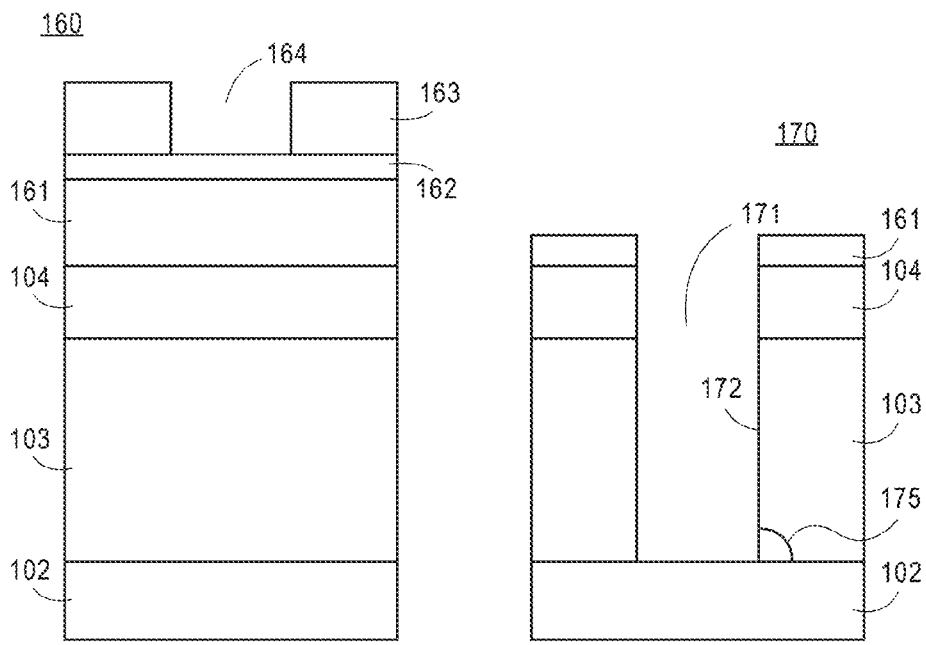
FIG. 1G  FIG. 1H

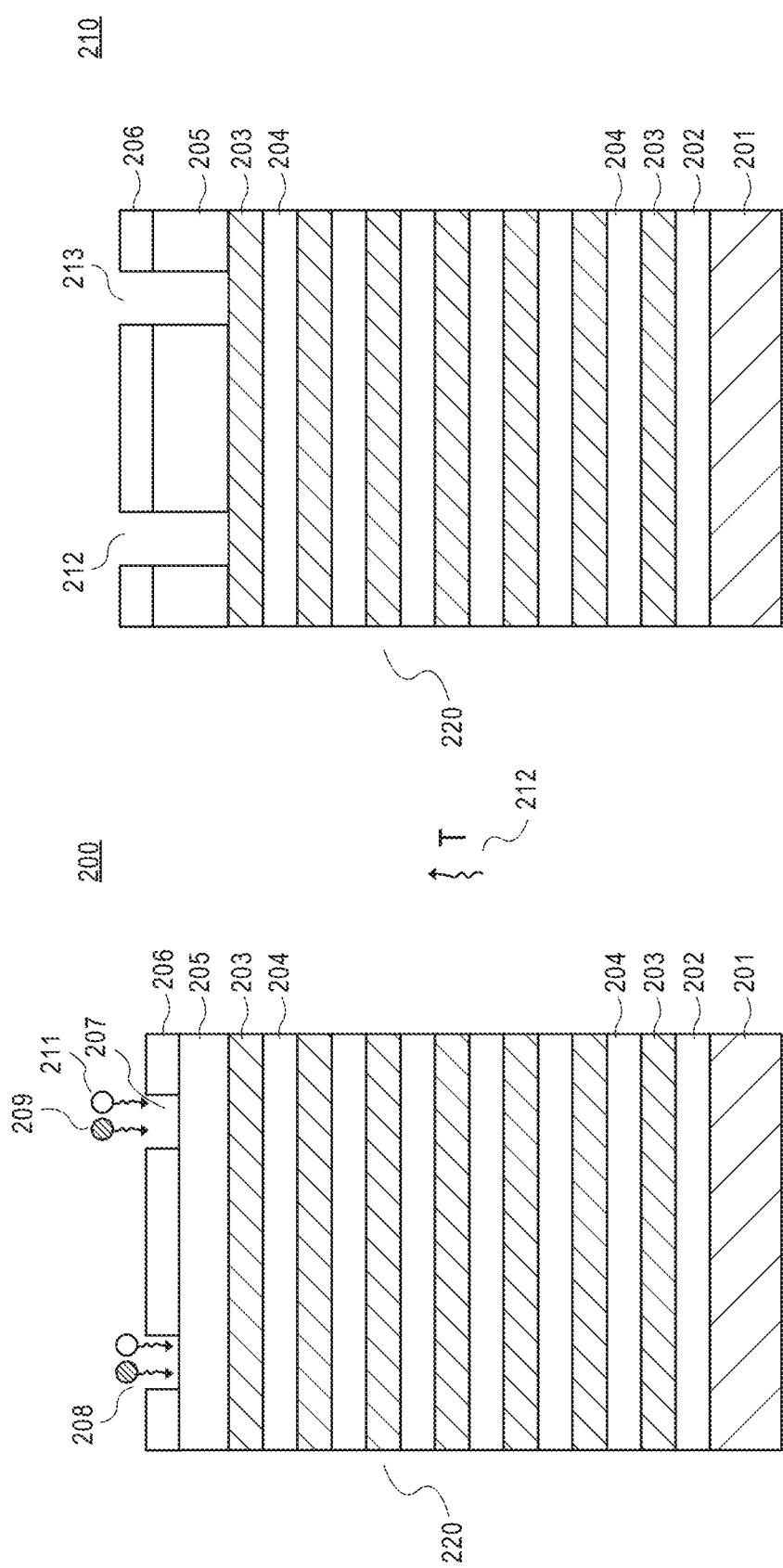

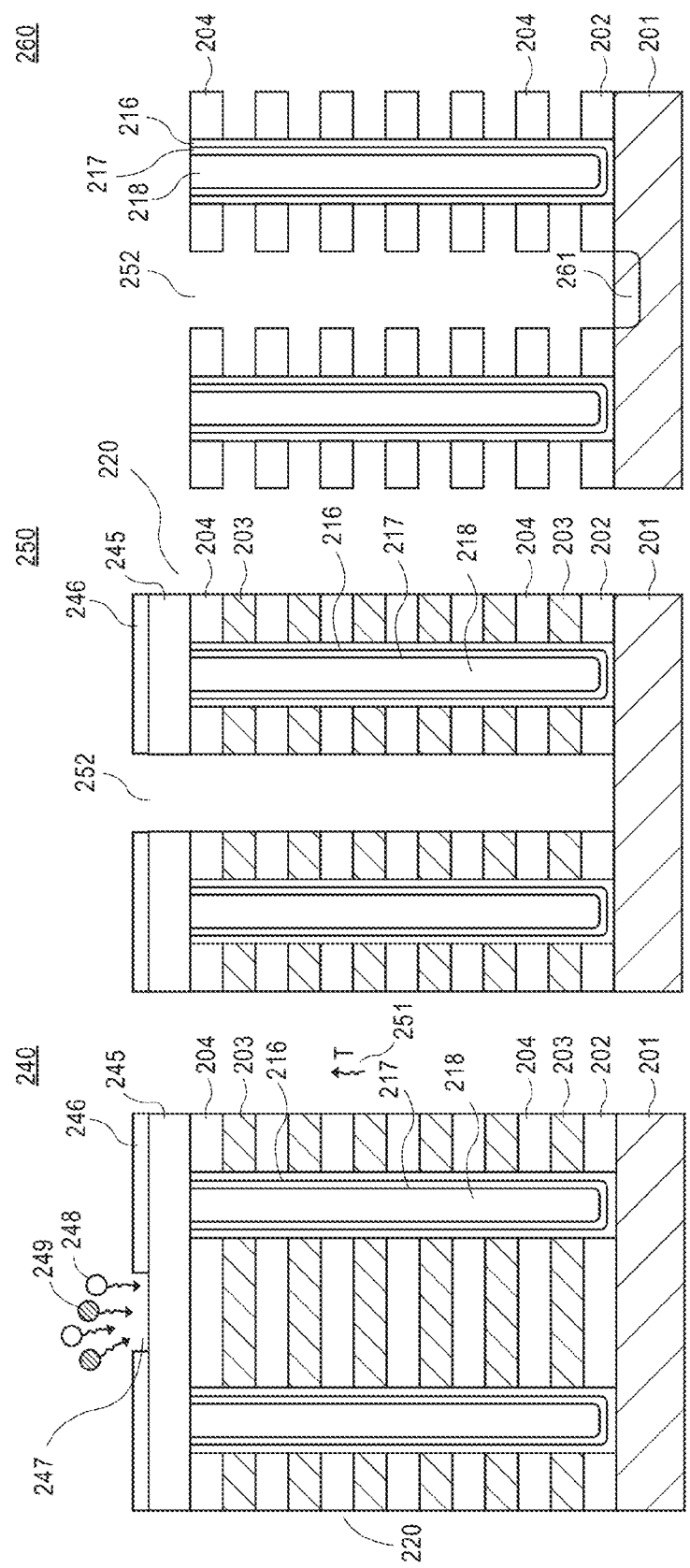

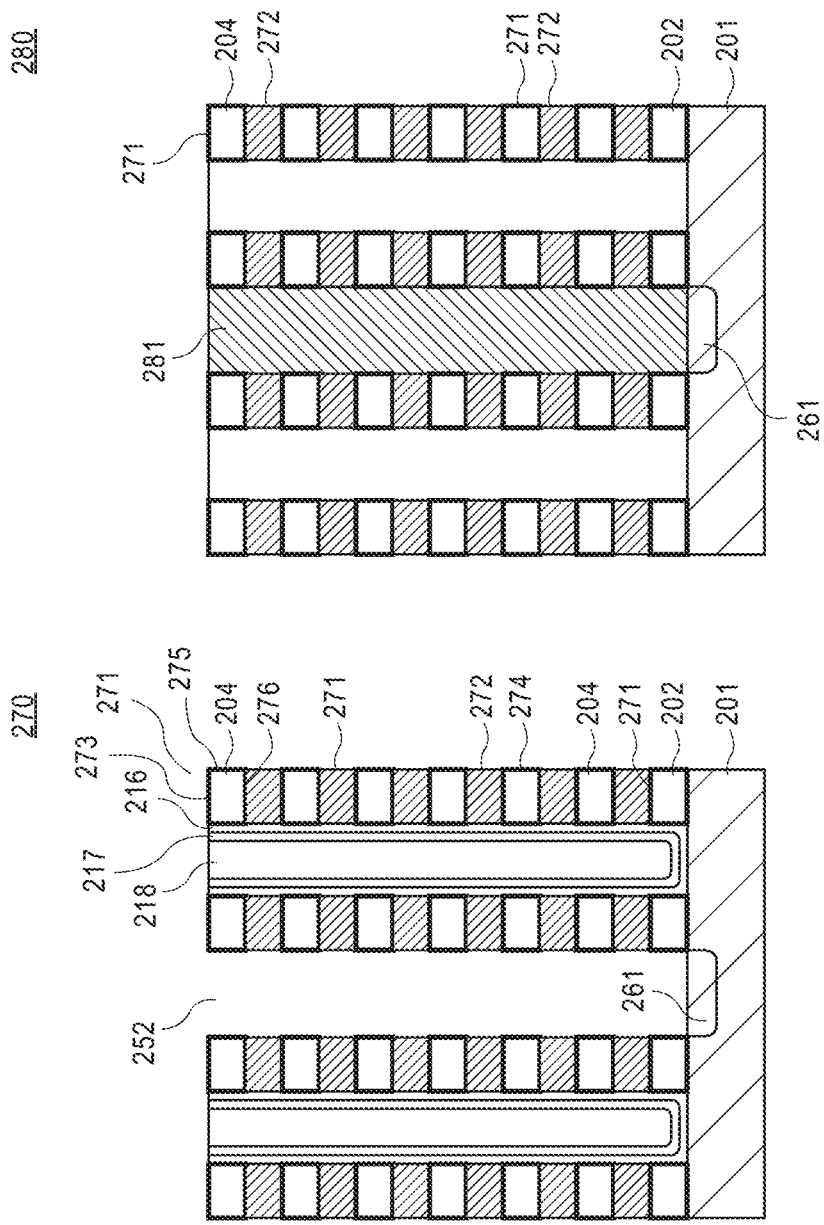

Table I

| | P | Ws | Wb | Cl2 | O2 | Temp | Time |
|---|---|---|---|---|---|---|---|
| I | $P_1$ | $W_{s1}$ | $W_{b1}$ | $F_{cl21}$ | $F_{o21}$ | $T_1$ | $t_1$ |
| II | $P_2$ | $W_{s2}$ | $W_{b2}$ | $F_{cl22}$ | $F_{o22}$ | $T_2$ | $t_2$ |
| III | $P_3$ | $W_{s3}$ | $W_{b3}$ | $F_{cl23}$ | $F_{o23}$ | $T_3$ | $t_3$ |

FIG. 4A

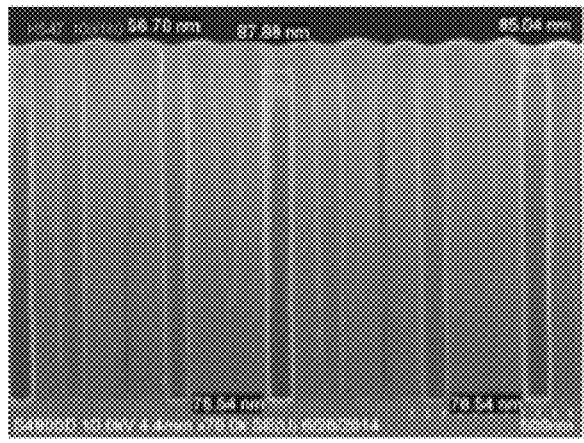

FIG. 4B

TABLE II

| | Dissociation reactions | BDE (eV) | $\sigma$ (Å$^2$) at 15 eV |
|---|---|---|---|
| A1 | $e^- + Cl_2 \rightarrow 2Cl + e^-$ | 2.5 | 14.99 |
| A2 | $e^- + BCl_3 \rightarrow BCl_2 + Cl + e^-$ | 4.8 | n/a |
| A3 | $e^- + BCl_2 \rightarrow BCl + Cl + e^-$ | 3.4 | n/a |
| A4 | $e^- + BCl \rightarrow B + Cl + e^-$ | 5.5 | n/a |

| | Ionization reactions | $E_{th}$ (eV) | $\sigma$ (Å$^2$) at 15 eV |
|---|---|---|---|
| A5 | $e^- + Cl_2 \rightarrow Cl_2^+ + e^-$ | 11.5 | 0.698 |
| A6 | $e^- + Cl \rightarrow Cl^+ + 2e^-$ | 13.0 | 0.522 |
| A7 | $e^- + BCl_3 \rightarrow BCl_3^+ + 2e^-$ | 11.4 | 0.515 |
| A8 | $e^- + BCl_3 \rightarrow BCl_2^+ + 2e^-$ | 12.5 | 1.231 |
| A9 | $e^- + BCl_3 \rightarrow BCl^+ + Cl_2 + 2e^-$ | 19.4 | 0.00 |
| A10 | $e^- + BCl_3 \rightarrow BCl_2 + Cl^+ + 2e^-$ | 22.3 | 0.00 |
| A11 | $e^- + BCl_2 \rightarrow BCl_2^+ + 2e^-$ | 8.8 | 1.109 |

MASK ETCH FOR PATTERNING

FIELD

Embodiments of the present invention pertain to the field of electronic device manufacturing, and in particular, to etch a mask for patterning.

BACKGROUND

Decreasing the dimensions of semiconductor devices and increasing the level of their integration are two of the major trends in the current semiconductor device manufacturing. As a result of these trends, the density of elements forming a semiconductor device continuously increases. The shrinkage of the semiconductor devices down to submicron dimensions requires that the routine fabrication of their elements also be performed on the submicron level. In addition, to increase the level of the device integration, semiconductor structures forming semiconductor devices may be stacked on top of each other. Typically, a three dimensional (3D) system refers to a system manufactured by stacking wafers, chips, or both and interconnecting them vertically using vias to achieve performance improvements at reduced power and smaller footprint than conventional two dimensional processes.

Generally, plasma etching is a form of plasma processing used to fabricate integrated circuits. It typically involves a high-speed stream of glow discharge (plasma) of an appropriate gas mixture being shot at a wafer. The plasma can contain ions, neutral atoms and radicals. Typically, a chip is fabricated using many layers of films. Each of these layers may be created using a mask that dictates the pattern of the layer. The accuracy of this pattern is extremely critical in manufacturing the chip. Generally, hard masks are used for etching deep, high aspect ratio (HAR) features that conventional photoresists cannot withstand. Typically, during the etching process free radicals react with the mask material and erode the mask. As a result, the mask integrity during the etching process is not maintained that negatively affects on the accuracy of the pattern crucial in the semiconductor chip manufacturing.

To maintain mask integrity conventional techniques to etch the HAR features use a thick stack of multiple hard mask layers. The conventional stack of hard mask layers lacks transparency so that the marks for mask alignment become invisible that affects the critical dimension controllability. Deposition and etching of the conventional hard masks require a long processing time that impacts the process efficiency and increases manufacturing cost.

SUMMARY

Embodiments of the present invention include methods and apparatuses to etch a mask to pattern features for an electronic device manufacturing.

In one embodiment, a first hard mask layer is deposited on a feature layer over a substrate. The first hard mask layer comprises an organic mask layer. An opening in the organic mask layer is formed using a first plasma at a first temperature greater than a room temperature to expose a portion of the feature layer. The first plasma comprises a halogen element.

In one embodiment, a first hard mask layer comprising an organic mask layer is deposited on a feature layer over a substrate. The organic mask layer comprises a dopant. An opening in the organic mask layer is formed using a first plasma at a first temperature greater than a room temperature to expose a portion of the feature layer. The first plasma comprises a halogen element.

In one embodiment, a first hard mask layer is deposited on a feature layer over a substrate. The first hard mask layer comprises an organic mask layer. An opening in the organic mask layer is formed using a first plasma comprising a halogen element at a first temperature greater than a room temperature to expose a portion of the feature layer. A second hard mask layer is deposited on the first hard mask layer. An opening in the second hard mask layer is formed using a second plasma.

In one embodiment, a first hard mask layer is deposited on a feature layer over a substrate. The first hard mask layer comprises an organic mask layer. An opening in the organic mask layer is formed using a first plasma comprising a halogen element at a first temperature greater than a room temperature to expose a portion of the feature layer. The feature layer comprises one or more insulating layers, one or more conductive layers, one or more semiconductor layers or any combination thereof.

In one embodiment, a first hard mask layer is deposited on a feature layer over a substrate. The first hard mask layer comprises an organic mask layer. An opening in the organic mask layer is formed using a first plasma at a first temperature greater than a room temperature to expose a portion of the feature layer. The first plasma comprises a halogen element, an oxygen element or any combination thereof.

In one embodiment, a first hard mask layer is deposited on a feature layer over a substrate. The first hard mask layer comprises an organic mask layer. An opening in the organic mask layer is formed using a plasma comprising a halogen element at a first temperature greater than a room temperature to expose a portion of the feature layer. One or more parameters are adjusted to control a profile of the opening, a critical diameter of the opening, or both. The one or more parameters comprise the first temperature, a gas flow rate, a bias power, a pressure, a source power, time, or any combination thereof.

In one embodiment, a first hard mask layer is deposited on a feature layer over a substrate. The first hard mask layer comprises an organic mask layer. An opening in the organic mask layer is formed using a first plasma at a first temperature greater than a room temperature to expose a portion of the feature layer. The first plasma comprises a halogen element. A passivation layer is formed on a sidewall of the opening using the first plasma.

In one embodiment, a first gas is supplied to a chamber. The first gas is to provide a first plasma comprising a halogen element. An organic mask layer comprising a dopant on an insulating layer over a substrate is etched using the halogen element at a first temperature to form an opening to expose a portion of the insulating layer.

In one embodiment, a first gas is supplied to a chamber to provide a first plasma. The first plasma comprises a halogen element. An organic mask layer comprising a dopant on an insulating layer over a substrate is etched using the halogen element at a first temperature to form an opening to expose a portion of the insulating layer. The first temperature is greater than a room temperature. Etching of the organic mask layer comprises removing a second gas comprising the dopant coupled to the halogen element.

In one embodiment, a first gas is supplied to a chamber to provide a first plasma comprising a halogen element. An organic mask layer comprising a dopant on an insulating layer over a substrate is etched using the halogen element at a first temperature to form an opening to expose a portion of the insulating layer. The first temperature is adjusted to control a profile of the opening, a critical diameter of the opening, or both.

In one embodiment, a first gas is supplied to a chamber to provide a first plasma comprising a halogen element. An organic mask layer comprising a dopant on an insulating layer over a substrate is etched using the halogen element at a first temperature to form an opening to expose a portion of the insulating layer. The insulating layer comprises an oxide layer, a nitride layer, or any combination thereof.

In one embodiment, a first gas is supplied to a chamber to provide a first plasma comprising a halogen element. An organic mask layer comprising a dopant on an insulating layer over a substrate is etched using the halogen element at a first temperature to form an opening to expose a portion of the insulating layer. A second gas is supplied to the chamber to provide a second plasma. An antireflective coating layer on the organic mask layer is etched using the second plasma at a second temperature lower than the first temperature.

In one embodiment, a first gas is supplied to a chamber to provide a first plasma comprising a halogen element. An organic mask layer comprising a dopant on an insulating layer over a substrate is etched using the halogen element at a first temperature to form an opening to expose a portion of the insulating layer. A passivation layer is formed on a sidewall of the opening using the first plasma.

In one embodiment, a first gas is supplied to a chamber to provide a first plasma comprising a halogen element. An organic mask layer comprising a dopant on an insulating layer over a substrate is etched using the halogen element at a first temperature to form an opening to expose a portion of the insulating layer. A third gas is supplied into the chamber to provide a third plasma. The exposed portion of the insulating layer is etched using the third plasma.

In one embodiment, a system to manufacture an electronic device comprises a processing chamber having a stage to position a wafer comprising a first hard mask layer on a feature layer over a substrate. The first hard mask layer comprises an organic mask layer. The processing chamber comprises an inlet to input a first gas to provide a first plasma comprising a halogen element. At least one power source is coupled to the processing chamber. The processing chamber has a first configuration to form an opening in the first hard mask layer using the first plasma at a first temperature greater than a room temperature to expose a portion of the feature layer.

In one embodiment, a system to manufacture an electronic device comprises a processing chamber having a stage to position a wafer comprising a first hard mask layer on a feature layer over a substrate. The first hard mask layer comprises an organic mask layer. The processing chamber comprises an inlet to input a first gas to provide a first plasma comprising a halogen element. At least one power source is coupled to the processing chamber. The processing chamber has a first configuration to form an opening in the first hard mask layer using the first plasma at a first temperature greater than a room temperature to expose a portion of the feature layer. The organic mask layer comprises boron. The processing chamber comprises an outlet to remove a second gas comprising the dopant coupled to the halogen element.

In one embodiment, a system to manufacture an electronic device comprises a processing chamber having a stage to position a wafer comprising a first hard mask layer on a feature layer over a substrate. The first hard mask layer comprises an organic mask layer. A second hard mask layer is deposited on the first hard mask layer. The processing chamber comprises an inlet to input a first gas to provide a first plasma comprising a halogen element. At least one power source is coupled to the processing chamber. The processing chamber has a first configuration to form an opening in the first hard mask layer using the first plasma at a first temperature greater than a room temperature to expose a portion of the feature layer. The chamber has a second configuration to form an opening in the second hard mask layer using a second plasma at a second temperature lower than the first temperature.

In one embodiment, a system to manufacture an electronic device comprises a processing chamber having a stage to position a wafer comprising a first hard mask layer on a feature layer over a substrate. The first hard mask layer comprises an organic mask layer. The processing chamber comprises an inlet to input a first gas to provide a first plasma comprising a halogen element. At least one power source is coupled to the processing chamber. The processing chamber has a first configuration to form an opening in the first hard mask layer using the first plasma at a first temperature greater than a room temperature to expose a portion of the feature layer. The first plasma comprises an oxygen element. The processing chamber has a third configuration to adjust one or more parameters to control a profile of the opening, a critical diameter of the opening, or both, the one or more parameters comprising the first temperature, a gas flow rate, a bias power, a pressure, a source power, time, or any combination thereof.

In one embodiment, a system to manufacture an electronic device comprises a processing chamber having a stage to position a wafer comprising a first hard mask layer on a feature layer over a substrate. The first hard mask layer comprises an organic mask layer. The processing chamber comprises an inlet to input a first gas to provide a first plasma comprising a halogen element. At least one power source is coupled to the processing chamber. The processing chamber has a first configuration to form an opening in the first hard mask layer using the first plasma at a first temperature greater than a room temperature to expose a portion of the feature layer. The processing chamber has a fourth configuration to form a passivation layer on a sidewall of the opening using the first plasma.

In one embodiment, a system to manufacture an electronic device comprises a processing chamber having a stage to position a wafer comprising a first hard mask layer on a feature layer over a substrate. The first hard mask layer comprises an organic mask layer. The processing chamber comprises an inlet to input a first gas to provide a first plasma comprising a halogen element. At least one power source is coupled to the processing chamber. The processing chamber has a first configuration to form an opening in the first hard mask layer using the first plasma at a first temperature greater than a room temperature to expose a portion of the feature layer. The feature layer comprises one or more insulating layers, one or more conductive layers, one or more semiconductor layers, or any combination thereof Other features of the present invention will be apparent from the accompanying drawings and from the detailed description which follows.

BRIEF DESCRIPTION OF THE DRAWINGS

The embodiments as described herein are illustrated by way of example and not limitation in the figures of the accompanying drawings in which like references indicate similar elements.

FIG. 1E is a view similar to FIG. 1D after the patterned hard mask layer is removed and one or more conductive layers are deposited into the opening according one embodiment.

FIG. 1F is a view similar to Figure E, after portions of the conductive layers are removed from the top portions of the feature layer to form an interconnect and a device feature is deposited on the top portion of the interconnect according to one embodiment.

FIG. 1G is a side view of an exemplary embodiment of a wafer according to another embodiment.

FIG. 1H is a view similar to FIG. 1G after an opening in the hard mask layer is formed according to another embodiment.

FIG. 2A is a side view of an exemplary embodiment of a wafer to provide a 3D system according to one embodiment.

FIG. 2B is a view similar to FIG. 2A after openings are formed in a hard mask layer according to one embodiment.

FIG. 2E is a view similar to FIG. 2D after a patterned hard mask layer on a hard mask layer are formed on the top oxide layer of the feature layer according to one embodiment.

FIG. 2F is a view similar to FIG. 2E after an opening in the feature layer is formed according to one embodiment.

FIG. 2G is a view similar to FIG. 2F after the patterned hard mask layers and nitride layers are removed, and a common source line region is formed according to one embodiment.

FIG. 2H is a view similar to FIG. 2G after conductive layers are formed according to one embodiment.

FIG. 2I is a view similar to FIG. 2H after one or more dielectric layers are deposited into the opening according one embodiment.

FIG. 4A is a view of a table I showing parameters to etch a hard mask layer according to one embodiment.

FIG. 4B shows an image depicting a plurality of HAR openings formed according to one embodiment.

FIG. 5 is a view of a table II including electron impact reactions in BCl2/Cl2 plasmas, with the bond dissociation energies (BDE), threshold energies (Eth), and the reaction cross-sections (σ) according to one embodiment.

DETAILED DESCRIPTION

Figure 1A:
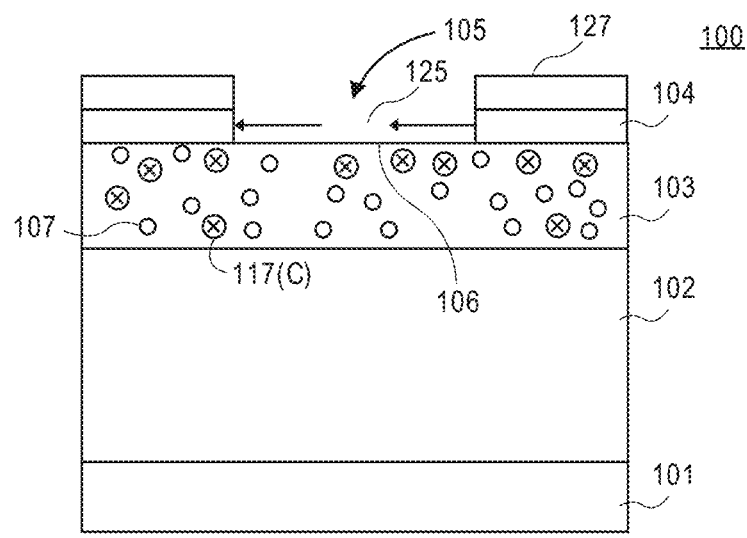
FIG. 1A is a side view of an exemplary embodiment of a wafer according to one embodiment.

Methods and apparatuses to etch a mask to pattern features for an electronic device manufacturing are described herein. In the following description, numerous specific details, such as specific materials, chemistries, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

In one embodiment, a first hard mask layer is deposited on a feature layer over a substrate. The first hard mask layer comprises an organic mask layer. An opening in the organic mask layer is formed using a first plasma at a first temperature greater than a room temperature to expose a portion of the feature layer. The first plasma comprises a halogen element.

Embodiments described herein relate to etching a hard mask film for patterning using an etch chemistry in an etch chamber. In one embodiment, the hard mask film is a doped advanced patterning film (APF). In one embodiment, the hard mask film comprises boron and carbon. In one embodiment, the hard mask film is a Saphira™ film produced by Applied Materials, Inc., located in Santa Clara, Calif. that has superior etch selectivity comparing to conventional hard masks. A Saphira™ mask is a next generation hard mask that can be used for any contact mask applications. The Saphira™ mask can be used for example, for a flash 3D VNAND system, a DRAM storage node for high aspect ratio capacitors for logic applications and line/space applications (e.g., gate, bitline).

In one embodiment, the hard mask has a superior etch selectivity compared to the conventional hard masks. Embodiments of methods and apparatuses to etch a hard mask as described herein advantageously allow to use substantially less hard mask material while improving pattern transfer parameters, e.g., a critical dimension (CD), a pattern profile, a line width roughness (LWR) and a line edge roughness (LER) comparing to the conventional techniques. In one embodiment, the hard mask is a Saphira™ mask.

In another embodiment, the hard mask has higher mechanical strength, lower stress and higher transparency comparing with conventional hard masks. The embodiments to etch the hard mask described herein can be advantageously used for advanced patterning applications, such as a 3-D memory etch, a deep contact etch and a line/space patterning with smaller CD and tighter pitch comparing with conventional techniques. In one embodiment, the hard mask is a Saphira™ mask.

In one embodiment, a hard mask is etched using halogen etchants and oxygen gas in a plasma environment. The embodiments described herein provide greater verticality of a profile and higher aspect ratio of a patterned feature, greater CD control of a bottom and a top of the patterned feature, greater selectivity to a dielectric anti-reflective coating (DARC), an oxide mask, or both comparing with conventional techniques. The patterned feature can be e.g., a VNAND channel hole, a DRAM storage node, an interconnect, a conductive line, a gate, or any other patterned feature. The embodiments described herein provide higher selectivity to a common underlayer/substrate material, such as silicon oxide, silicon nitride, polysilicon, metal, or any other underlayer/substrate material, so that pattern erosion and substrate loss during the hard mask etch is minimized comparing with conventional techniques. The embodiments described herein increase the etch rate of the hard mask to improve throughput to be practical and manufacturing-worthy. In one embodiment, the hard mask is advantageously etched using readily available etchant and gases in etch chambers that minimizes a need for an "exotic" chemical.

In one embodiment, halogen containing etchants, e.g., chlorine ($Cl_2$) are used along with an oxygen ($O_2$) in a plasma environment to etch a hard mask. In one embodiment, due to the high aspect ratio and need for precise CD control, the hard mask is etched at an elevated temperature greater than a room temperature to increase a by-product volatility. In one embodiment, the elevated temperature is adjusted to tune the CD, the profile of the patterned feature, or both. In one embodiment, the elevated temperature is adjusted by adjusting the temperature of an electrostatic chuck (ESC).

FIG. 1A is a side view of an exemplary embodiment of a wafer 100 according to one embodiment. Wafer 100 comprises a hard mask layer 103 on a feature layer 102 over a substrate 101. In an embodiment, substrate 101 includes a semiconductor material, e.g., silicon ("Si"), germanium ("Ge"), silicon germanium ("SiGe"), a III-V materials based material e.g., gallium arsenide ("GaAs"), or any combination thereof. In one embodiment, substrate 101 includes metallization interconnect layers for integrated circuits. In one embodiment, substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, substrate 101 includes interconnects, for example, vias, configured to connect the metallization layers.

In one embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon. In an embodiment, substrate includes an insulating layer—e.g., an oxide layer, such as silicon oxide, aluminum oxide, silicon oxide nitride, a silicon nitride layer, any combination thereof, or other electrically insulating layer determined by an electronic device design. In one embodiment, the insulating layer of the substrate 101 comprises an interlayer dielectric (ILD)—e.g., silicon dioxide. In one embodiment, the insulating layer of the substrate 101 includes polyimide, epoxy, photodefinable materials, such as benzocyclobutene (BCB), and WPR-series materials, or spin-on-glass. In an embodiment, the insulating layer of the substrate is an insulating layer suitable to insulate adjacent devices and prevent leakage.

In one embodiment, feature layer 102 comprises one or more insulating layers, one or more conductive layers, one or more semiconductor layers, or any combination thereof to manufacture one or more microelectronic devices. In one embodiment, feature layer 102 is an insulating layer. In an embodiment, feature layer 102 comprises an oxide layer, e.g., silicon oxide, aluminum oxide ("Al2O3"), silicon oxide nitride ("SiON"), a nitride layer, e.g., silicon nitride, other electrically insulating layer, or any combination thereof. In another embodiment, feature layer 102 comprises a nitride layer (e.g., silicon nitride), or other nitride layer. In yet another embodiment, feature layer 102 comprises polysilicon, an amorphous silicon, metal, or any combination thereof. In an embodiment, feature layer 102 is a stack of layers.

In one embodiment, feature layer 102 is a stack of dielectric layers, for example, an oxide, nitride, or any combination thereof. In one embodiment, feature layer 102 is a silicon nitride layer. In one embodiment, feature layer 102 is a silicon oxide layer. In yet another embodiment, feature layer 102 comprises a silicon oxide layer on a silicon nitride layer. In yet another embodiment, feature layer 102 comprises a silicon nitride layer on a silicon oxide layer. In yet another embodiment, the feature layer 102 comprises a stack of oxide and nitride layers deposited on top of each other.

In an embodiment, feature layer 102 comprises a semiconductor material—e.g., monocrystalline silicon ("Si"), polycrystalline Si, amorphous Si, germanium ("Ge"), silicon germanium ("SiGe"), a III-V materials based material (e.g., gallium arsenide ("GaAs")), or any combination thereof. In an embodiment, feature layer 102 comprises a metal, for example, copper (Cu), aluminum (Al), indium (In), tin (Sn), lead (Pb), silver (Ag), antimony (Sb), bismuth (Bi), zinc (Zn), cadmium (Cd), gold (Au), ruthenium (Ru), nickel (Ni), cobalt (Co), chromium (Cr), iron (Fe), manganese (Mn), titanium (Ti), hafnium (Hf), tantalum (Ta), tungsten (W), vanadium (V), molybdenum (Mo), palladium (Pd), gold (Au), platinum (Pt), polysilicon, other conductive layer known to one of ordinary skill in the art of electronic device manufacturing, or any combination thereof.

In at least some embodiments, the thickness of feature layer 102 is from about 20 nm to about 5 microns (μm) depending on a design. In one embodiment, the thickness of the feature layer 102 is at least 2400 nm (24000 angstroms). In one embodiment, the thickness of each of the oxide and nitride layers of the feature layer 102 is in an approximate range from about 20 nanometers ("nm") to about 70 nm. In one embodiment, the thickness of the feature layer 102 is from about 2400 nm to about 4200 nm (42000 angstroms).

Feature layer 102 can be deposited using one or more deposition techniques, such as but not limited to a chemical vapour deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

As shown in FIG. 1A, hard mask layer 103 comprises one or more dopants, such as a dopant 107 and one or more mask material elements, such as a mask element 117. In one embodiment, dopant 107 is boron and mask element 117 is carbon. In one embodiment, hard mask layer 103 comprises boron, carbon and hydrogen. In one embodiment, the hard mask layer 103 comprises at least 50% of boron. In another embodiment, the hard mask layer 103 comprises from about 50% by weight (wt) to about 70% by wt of boron. In one embodiment, hard mask layer 103 comprises from about 1 weight (wt). % boron to about 80 wt. % boron. In another embodiment, the hard mask layer 103 comprises from about 50% by wt to about 70% by wt of boron. In one embodiment, hard mask layer 103 comprises from about 30% to about 70% by wt of boron, from about 25% to about 50% of carbon and from about 5% to about 40% of hydrogen.

In alternate embodiments, dopant 107 is other dopant element, for example nitrogen, silicon, or other dopant element. In alternate embodiments, mask element 117 is other mask element, for example polysilicon. In one embodiment, hard mask layer 103 is a semi-conductive mask layer. In one embodiment, hard mask layer 103 is harder than a conventional carbon hard mask. In one embodiment, the Young modulus of the hard mask layer 103 is at least 20 Gigapascals (GPa).

In one embodiment, hard mask layer 103 is an organic mask layer. In one embodiment, hard mask layer 103 is a polymer hard mask. In one embodiment, hard mask layer 103 is a carbon hard mask layer. In one embodiment, hard mask layer 103 is a Saphira™ hard mask layer produced by Applied Materials, Inc., located in Santa Clara, Calif. In one embodiment, hard mask layer 103 is a boron doped amorphous carbon layer. In one embodiment, hard mask layer 103 comprises one or more of Advanced Patterning Film (APF) carbon hard masks produced by Applied Materials, Inc., located in Santa Clara, Calif. Generally, the purpose of the hard mask layer is to protect specific regions of the one or more layers covered by the hard mask from unnecessary etching. Because photoresist may erode during etching of the underlying layer, the hard mask layer is deposited between the underlying layer and a photoresist layer.

Generally, the thickness of the hard mask layer 103 depends on an application. In one embodiment, the thickness of the hard mask layer 103 is from about 100 nm to about 1700 nm. In one embodiment, the thickness of the hard mask layer 103 is less than 1300 nm. In more specific embodiment, the thickness of the hard mask layer is from about 500 nm to about 1000 nm. In one embodiment, the hard mask layer 103 is deposited using deposition gases containing boron, e.g., diborane (B2H2), or other boron containing gases, and carbon, e.g., acetylene (C2H2), or other carbon containing gases.

The hard mask layer 103 can be deposited onto the feature layer using one or more deposition techniques, such as but not limited to a chemical vapour deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

As shown in FIG. 1A, a hard mask layer 104 is deposited on the hard mask layer 103. The hard mask layer 104 is patterned to form an opening 105 to expose a portion 106 of hard mask layer 103. In one embodiment, hard mask layer 104 is an antireflective coating (ARC) layer. In another embodiment, the hard mask layer 104 is a DARC layer. In one embodiment, the hard mask layer 104 is a SiON mask layer. Typically, the antireflective coating layer is deposited underneath of a photoresist layer to absorb the scattered light during lithography to increase accuracy of transferring a pattern from the photoresist to the underlying layer. In one embodiment, the hard mask layer 104 includes a bottom polymer antireflective coating layer ("BARC") deposited on a DARC layer. In another embodiment, the hard mask layer 104 is a stack of a silicon based ARC layer on a spin-on-carbon layer on a DARC layer. In yet another embodiment, the hard mask layer 104 comprises a silicon carbide, silicon carbide oxide (SiOC), silicon oxide nitride, aluminum nitride, amorphous Si, silicon oxide, a nitride layer (e.g., silicon nitride) or other material layer that is selective to the hard mask layer 103. In one embodiment, the thickness of the hard mask layer 104 is from about 50 nm to about 200 nm. In more specific embodiment, the thickness of the hard mask layer 104 is from about 80 nm to about 100 nm.

Figure 9:
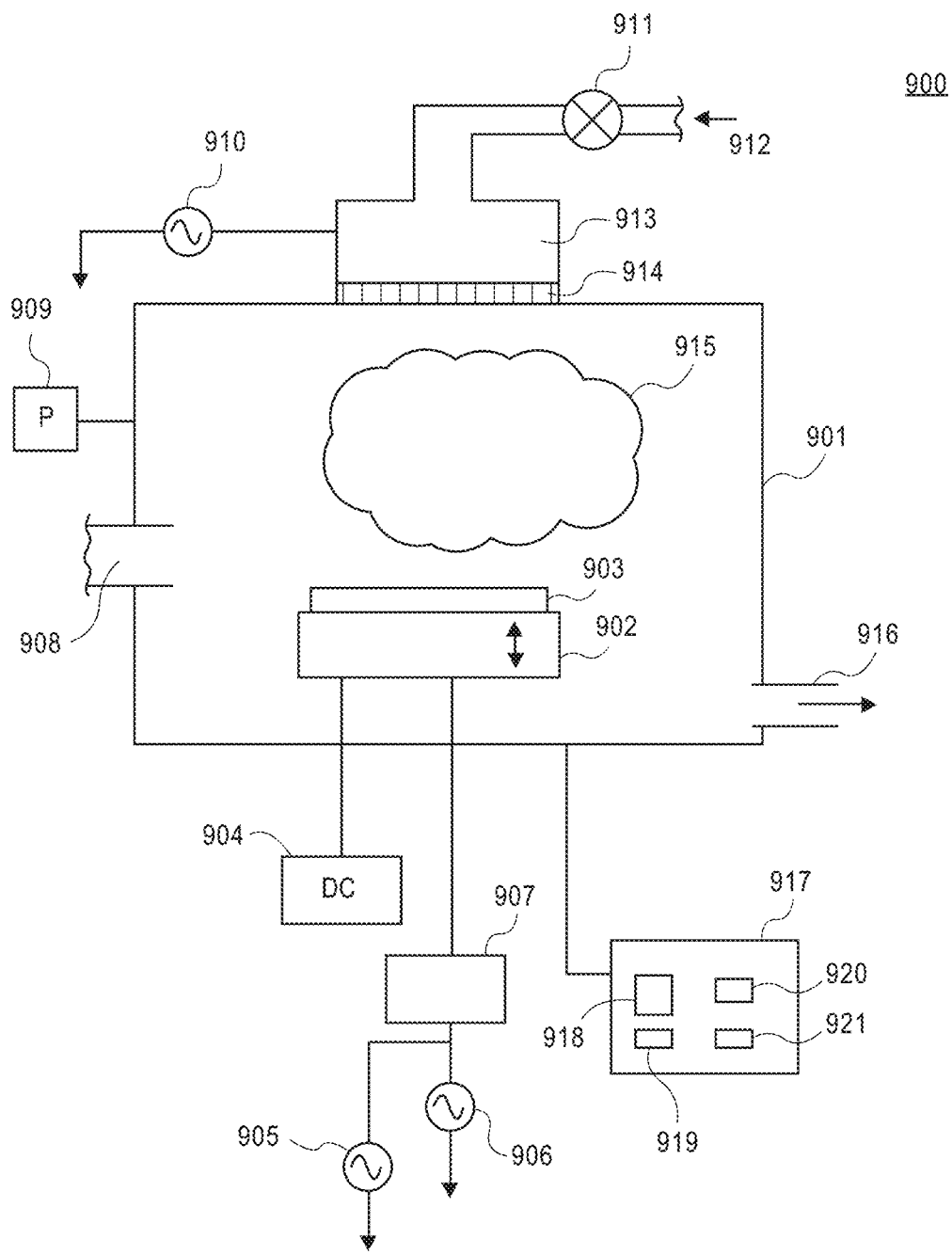
FIG. 9 shows a block diagram of one embodiment of a plasma system to provide mask etch according to one embodiment.

In one embodiment, the width 125 of the opening 105 is determined by design. In one embodiment, the width 125 is in an approximate range from about 2 nm to about 200 nm. In more specific embodiment, the width 125 is from about 20 nm to about 80 nm. In at least some embodiments, a photoresist layer 127 is deposited and patterned on the hard mask layer 104 using one of the photoresist deposition and patterning techniques known to one of ordinary skill in the art of electronic device manufacturing. In at least some embodiments, the hard mask layer 104 is etched through the patterned photoresist using a process gas containing fluorine, such as $C_xH_zF_y$, where x, y can be any integer excluding zero, and z can be any integer including zero, e.g., $CF_4$, $CHF_3$, oxygen and argon at a room temperature from about 20 degrees C. to about 30 degrees C. In an embodiment, the hard mask layer 104 is selectively etched in a plasma chamber as depicted in FIG. 9, or any other plasma chamber using one of the plasma etching techniques known to one of ordinary skill in the art of electronic device manufacturing. In at least some embodiments, the hard mask layer 104 is etched in an inductively coupled plasma (ICP) chamber. In at least some other embodiments, the hard mask layer 104 is etched in a capacitively coupled plasma (CCP) chamber.

Figure 1B:
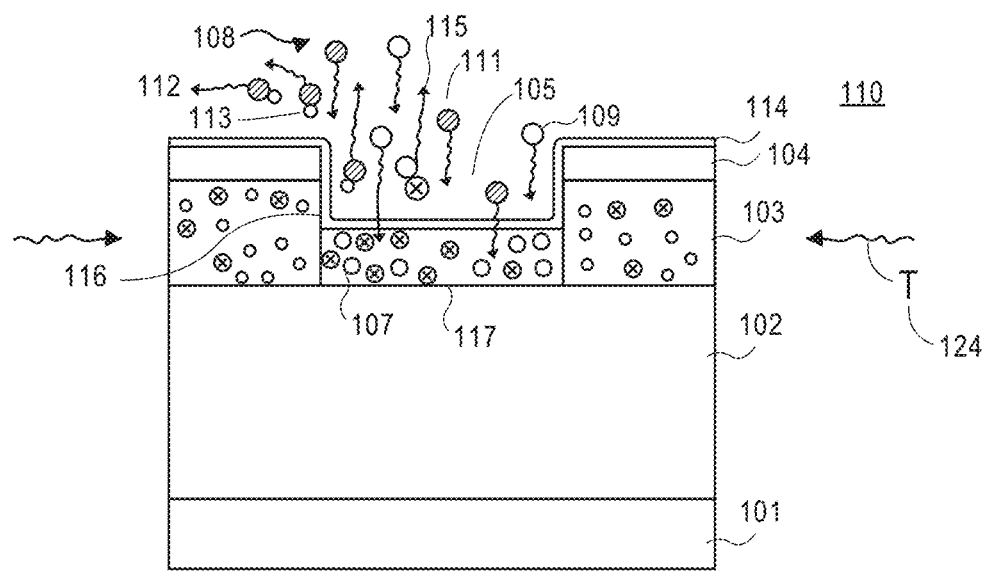
FIG. 1B is a view similar to FIG. 1A illustrating forming an opening in a hard mask layer according to one embodiment.

FIG. 1B is a view 110 similar to FIG. 1A illustrating forming an opening in the hard mask layer according to one embodiment. As shown in FIG. 1B, the exposed portion 106 of the hard mask layer 103 is etched through opening 105 using a gas 108 to produce plasma particles (elements), such as a plasma element 109 and a plasma element 111 at an elevated temperature 124 that is greater than the room temperature. In one embodiment, the elevated temperature 124 is greater than 30 degrees C. In one embodiment, the elevated temperature 124 is from about 160 degrees C. to about 250 degrees C. As shown in FIG. 1B, photoresist layer 127 is etched out completely during etching the hard mask layer 103. Generally, plasma particles (elements) refer to atoms, molecular radicals and positive ions that are more chemically reactive than the normal molecular gases using which the plasma elements are produced. In one embodiment, gas 108 contains halogen, such as chlorine ($Cl_2$), fluorine, bromine, iodine, other halogen, or any combination thereof and oxygen ($O_2$). In one embodiment, plasma element 109 represents an oxygen element, and plasma element 111 represents a halogen element. In another embodiment, gas 108 comprises chlorine, oxygen, and one or more other gases, e.g., argon, nitrogen, helium, other gas, or any combination thereof.

As shown in FIG. 1B, halogen plasma elements, such as halogen element 111 and oxygen elements, such as oxygen plasma element 109 react with dopants, such as dopant 107 and mask material elements, such as mask material element 117 to produce volatile by-products, such as volatile products 113, and 115 and non-volatile products. In one embodiment, volatile by-product 113 is a dopant coupled to the halogen element, and volatile by-product 115 is a mask material element coupled to oxygen element. As shown in FIG. 1B, a passivation layer 114 is formed on a sidewall 116 of the opening. In one embodiment, passivation layer 114 comprises non-volatile products, such as a dopant coupled to the oxygen element and a mask material element coupled to the halogen element. In one embodiment, the volatile by-products comprise boron chloride, boron hydride, boron bromide, boron fluoride, CO, CO2, or any combination thereof.

FIG. 5 is a view 501 showing a table II including electron impact reactions in BCl2/Cl2 plasmas, with the bond dissociation energies (BDE), threshold energies (Eth), and the reaction cross-sections ($\sigma$) according to one embodiment. Table II shows different reactions (A1 to A11) that are typically formed in a BCl3/Cl2 plasma. As shown in Table II, BxCly products can be easily dissociated with low energies in a plasma, in part due to BCl products low vapor pressure. There are various BxCly products that can be easily formed that are highly volatile.

Referring back to FIG. 1B, passivation layer 114 comprising the non-volatile products is deposited on the top and sidewall portions of the hard mask layer 104 and on the sidewalls, such as a sidewall 116 and bottom of the opening formed in the hard mask layer 103. In one embodiment, the thickness of the passivation layer 114 is from about 1 angstrom to about 20 angstroms. The volatile products, such as volatile products 113 and 115 are removed from the wafer as a part of a gas 112, as shown in FIG. 1B. In one embodiment, the volatile products are removed from a wafer placed in a plasma etching chamber by a vacuum pump, as described in further detail below with respect to FIG. 9.

In one embodiment, the hard mask layer 103 of BxCyHz, where x, y and z can be any number except zero, is etched using Cl2 and O2 containing gases according to the following formula:

$$BxCyHz + Cl2 + O2 \rightarrow BxCly(gas) + CO(gas) + OH(gas) + CCl(solid) + B2O3(solid). \quad (1)$$

In one embodiment, the volatile by-product gas 112 comprises BxCly, C, and OH. In one embodiment, passivation layer 114 comprises CCl and B2O3. In at least some embodiments, one or more etching parameters are adjusted to control one or more parameters of an opening in the hard mask layer 103, such as a profile, a critical diameter, or both. The one or more etching parameters comprise an etch temperature, an etch gas flow rate, a bias power applied to the electrostatic chuck on which the wafer to be etched is positioned, a pressure supplied to the etching chamber, a source power applied to the etching chamber, time, or any combination thereof.

In at least some embodiments, Cl2 and O2 containing gases are used and process parameters in a high temperature electrostatic chuck (ESC) plasma chamber are optimized to vertically etch contact and slit masks with high aspect ratio (e.g., greater than 15:1) for patterning an underlayer 3D NAND node or a storage node capacitor. Generally, the aspect ratio refers to a ratio of the depth of the opening to the width of the opening. In at least some embodiments, to etch hard mask layer 103 a gas chemistry composed of Cl2 and O2 or similar gases are used to produce BxCly and CxOy by-products, where x and y can be any integer except zero. Both BxCly and CxOy etch by-products are volatile and are get pumped out of the etching chamber. The non-volatile by-products will act as a passivation layer to define the patterned layers. With Cl2/O2 chemistry, the non-volatile by-products are BxOy and CxCly that form the sidewall passivation. In one embodiment, the elevated temperature 124 is adjusted to control parameters of the opening in the hard mask layer 103, e.g., a profile, a critical diameter, or both. In one embodiment, the selectivity of the mask 104 to etch hard mask layer 103 is controlled by etching temperature 124. In one embodiment, the selectivity of the mask 104 to etch hard mask layer 103 is increased with increasing the temperature 124.

FIG. 4A is a view 400 of a table I (401) showing parameters to etch a hard mask layer according to one embodiment. The hard mask layer is represented by hard mask layer 103. As shown in table 401, etching the hard mask layer involves performing etching operations I, II and III having time durations $t_1$, $t_2$, and $t_3$ respectively to maintain the profile and avoid tapering of the opening. At a first etching operation I, a pressure P in a processing chamber is $P_1$, a source power $W_s$ applied to the processing chamber is $W_{s1}$, a bias power $W_b$ applied to an electrostatic chuck in the processing chamber is $W_{b1}$, a flow rate of $Cl_2$ gas is $F_{c121}$, a flow rate of $O_2$ gas is $F_{o21}$, an etching temperature T is $T_1$. Then at a second etching operation II, a pressure P in a processing chamber is $P_2$, a source power $W_s$ applied to the processing chamber is $W_{s2}$, a bias power applied to an electrostatic chuck in the processing chamber is $W_{b2}$, a flow rate of $Cl_2$ gas is $F_{c122}$, a flow rate of $O_2$ gas is $F_{o22}$, a temperature is $T_2$. Then at a third etching operation III, a pressure P in a processing chamber is $P_3$, a source power $W_s$ applied to the processing chamber is $W_{s3}$, a bias power applied to an electrostatic chuck in the processing chamber is $W_{b3}$, a flow rate of $Cl_2$ gas is $F_{c123}$, a flow rate of $O_2$ gas is $F_{o23}$, temperature is $T_3$. In one embodiment, $P_1$, $P_2$, and $P_3$ are similar. In another embodiment, at least two of $P_1$, $P_2$, and $P_3$ are different. In more specific embodiment, the pressure P in the processing chamber at each of the operations I, II, and III is maintained at about 35 milliTorrs (mT).

In one embodiment, controlling the density of the plasma elements in the processing chamber involves adjusting $W_s$. In one embodiment, $W_s$ is substantially the same at operations I, II, and III. In more specific embodiment, each of $W_{s1}$, $W_{s2}$, and $W_{s3}$ is about 1700 W. In another embodiment, at least two of $W_{s1}$, $W_{s2}$, and $W_{s3}$ are different.

In one embodiment, controlling at least one of energy and direction of plasma elements hitting the wafer involves adjusting $W_b$. In one embodiment, at least two of the $W_{b1}$, $W_{b2}$, and $W_{b3}$ are different. In another embodiment, $W_{b1}$, $W_{b2}$, and $W_{b3}$ are similar. In more specific embodiment, $W_{b3}$ is greater than each of $W_{b2}$ and $W_{b1}$. In more specific embodiment each of $W_{b2}$ and $W_{b1}$ is about 400 W, and $W_{b3}$ is about 500 W. In one embodiment, $W_b$ is increased to increase energy of plasma elements to reach the bottom, avoid tapering and maintain the vertical profile of the HAR opening.

In one embodiment, controlling the etching rate involves adjusting the flow rate of the $Cl_2$ gas. In one embodiment, $F_{cl21}$, $F_{cl22}$, and $F_{cl23}$ are similar. In more specific embodiment, the flow rate of the chlorine $Cl_2$ gas in the processing chamber is maintained at about 220 standard cubic centimeters per minute (sccm) through operations I, II, and III. In another embodiment, at least two of $F_{cl21}$, $F_{cl22}$, and $F_{cl23}$ are different.

In one embodiment, controlling the passivation layer 114 involves adjusting the flow rate of $O_2$. In one embodiment, at least two of $F_{o21}$, $F_{o22}$, and $F_{o23}$ are different. In another embodiment, $F_{o21}$, $F_{o22}$, and $F_{o23}$ are similar. In more specific embodiment, $F_{o21}$ is greater than $F_{o22}$ which is greater than $F_{o23}$ to decrease the passivation to avoid tapering and maintain the vertical profile of the HAR opening. In more specific embodiment, $F_{o21}$ is about 200 sccm, $F_{o22}$ is about 120 sccm, and $F_{o23}$ is about 90 sccm.

In one embodiment, controlling the etching temperature T involves adjusting the temperature of an ESC on which the wafer is positioned. In one embodiment, $T_1$, $T_2$, and $T_3$ are similar. In more specific embodiment, the temperature T of the ESC in the processing chamber is maintained in an approximate range from about 160 degrees C. to about 250 degrees C. at operations I, II, and III. In more specific embodiment, each of the $T_1$, $T_2$, and $T_3$ is about 195 degrees C. In another embodiment, at least two of $T_1$, $T_2$, and $T_3$ are different.

In one embodiment, at least two of $t_1$, $t_2$, and $t_3$ are different. In more specific embodiment, $t_2$ is greater than $t_3$ which is greater than $t1$. In more specific embodiment, $t_1$ is about 15 minutes, $t_2$ is about 45 minutes, and $t_3$ is about 40 minutes. In another embodiment, $t_1$, $t_2$, and $t_3$ are similar. As etching temperature increases, the volatilty of one or more by-products increases and the sticking coefficient of by-products decreases resulting in decreasing the number of by-products remaining on the wafer. Adjusting the elevated etching temperature provides an easy profile and CD control and tuning across the wafer. The elevated etching temperature is in an approximate range of 160 degrees C. to 250 degrees C. The versatility and ease of tuning CD and profile by adjusting the elevated etching temperature, and other process parameters as described herein provides a great advantage over conventional techniques. Another advantage of etching the hard mask layer at the elevated temperature as described herein is increase of the etch rate by at least a factor of two (e.g., 7000 angstroms per minute (A/m)) comparing with conventional techniaques. Yet another advantage of etching the hard mask layer of BCH at the elevated temperature as described herein is increase in selectivity to hard mask layer 104 of SiON. As etching temperature increases, less reactive gas flow is needed, which results in more hard mask layer 104 of SiON mask remaining.

FIG. 4B shows an image 410 depicting a plurality of HAR openings formed according to one embodiment. As shown in FIG. 4B, the width of the openings at the top is similar to the width of the openings at the bottom, so that the profile of the HAR openings is maintained substantially vertical.

Referring back to FIG. 1B, the hard mask layer 103 is selectively etched in a plasma chamber as depicted in FIG. 9, or any other plasma chamber using one of the plasma etching techniques known to one of ordinary skill in the art of electronic device manufacturing. In one embodiment, the hard mask layer 103 is etched in a CCP chamber. In another embodiment, the hard mask layer 103 is etched in an ICP chamber.

Figure 1C:
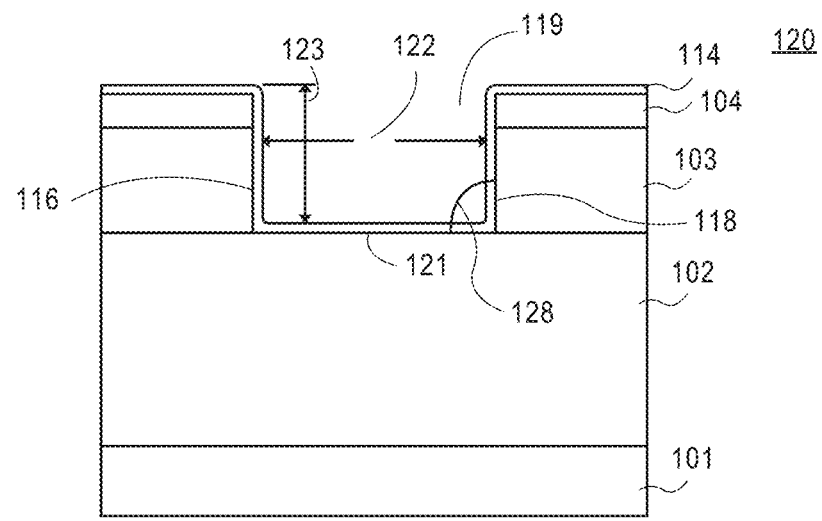
FIG. 1C is a view similar to FIG. 1B after an opening is formed in the hard mask layer to expose a portion of the feature layer according to one embodiment.

FIG. 1C is a view 120 similar to FIG. 1B after an opening 119 is formed in hard mask layer 103 to expose a portion 121 of the feature layer 102 according to one embodiment. As shown in FIG. 1C, portion 121 is a bottom portion of the opening 119. Opening 119 has opposing sidewalls, such as a sidewall 116 and a sidewall 118. Passivation layer 114 is deposited on the top portions of the hard mask layer 104, sidewalls 116 and 118 and bottom portion 121. The passivation layer 114 is used to avoid undercut so that sidewalls 116 and 118 are substantially perpendicular relative to bottom 121. In one embodiment, a vertical profile of the opening 119 is defined such that an angle between each of the sidewalls and the bottom of the opening 119, such as an angle 128 is about 90 degrees. In one embodiment, to maintain angle 128 at about 90 degrees, the thickness of the passivation layer 114 is reduced at operation III, as described above.

In one embodiment, the width 122 of the opening 119 is determined by width 125. In one embodiment, the width 122 of the opening 119 is from about 20 nm to about 80 nm. In one embodiment, the opening 119 is a hole having a predetermined diameter. In another embodiment, the opening 119 is a trench having the length substantially greater than the width. In one embodiment, a depth 123 of the opening 119 is determined by the thickness of the hard mask layer 104, the thickness of the etched hard mask layer 103, or a combination thereof. In one embodiment, the depth 123 is from about 100 nm to about 1300 nm. In one embodiment, the depth 123 is less than 1300 nm. In more specific embodiment, the depth 123 is from about 500 nm to about 1000 nm. In one embodiment, the aspect ratio of the opening 119 defined as a ratio of depth 123 to width 122 is greater than 15:1. In another embodiment, the aspect ratio of the opening 119 is at least 40:1. In yet another embodiment, the aspect ratio of the opening 119 is from about 10:1 to about 70:1.

Figure 1D:
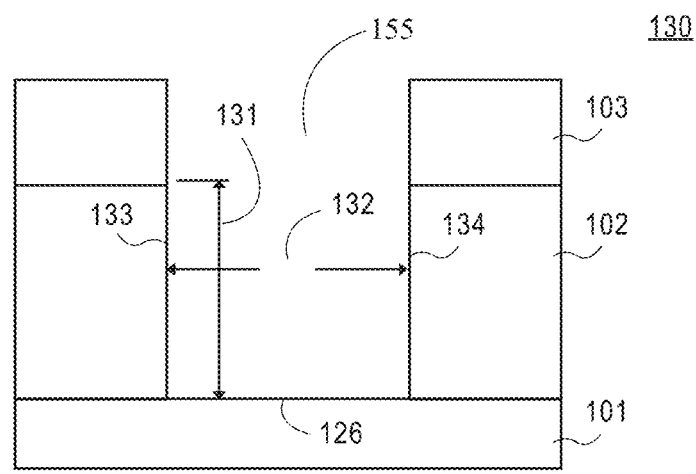
FIG. 1D is a view similar to FIG. 1C after an opening in the feature layer is formed according to one embodiment.

FIG. 1D is a view 130 similar to FIG. 1C after an opening 155 in feature layer 102 is formed according to one embodiment. As shown in FIG. 1D, passivation layer 114 depicted in FIG. 1C became a part of the feature layer 102 and patterned hard mask layer 103. In one embodiment, the patterned hard mask layer 104 is removed from the hard mask layer 103 during etching of the feature layer 102. Opening has opposing sidewalls 133 and 134 and a bottom portion 126.

In one embodiment, the opening 155 is a hole. In another embodiment, the opening 155 is a trench. In one embodiment, a width 132 of the opening 155 is determined by the width 125. In one embodiment, the width 132 of the opening 155 is from about 20 nm to about 80 nm. In one embodiment, a depth 131 of the opening 155 is determined by the thickness of the hard mask layer 103, the thickness of the etched feature layer 102, or both. In one embodiment, the depth 131 is from about 0.5 microns ("μm") to about 10 μm.

In one embodiment, the aspect ratio of the opening 155 is greater than 15:1. In another embodiment, the aspect ratio of the opening 155 is greater than 40:1. In yet another embodiment, the aspect ratio of the opening 155 is in the approximate range of 10:1 to 70:1.

In one embodiment, forming opening 155 involves etching the feature layer 102 through the patterned hard mask layer 103 and patterned hard mask layer 104 to expose the portion 126 of substrate 101 using plasma produced from a gas containing fluorine. In at least some embodiments, the gas to etch feature layer contains carbon and fluorine. In at least some embodiments, the gas to etch feature layer contains carbon, fluorine, e.g., CxFy, where x, y can be any integer, oxygen and argon. In at least some embodiments, the feature layer 102 is plasma etched at temperature in an approximate range of 20° C. to 30° C. In at least some embodiments, pressure to etch layer 102 is in an approximate range of 10 millitorrs to about 200 millitorrs. In alternate embodiments, feature layer 102 is etched in a CCP chamber, ICP chamber, remote plasma chamber, or any other plasma chamber known to one of ordinary skill in the art of electronic device manufacturing.

FIG. 1E is a view 140 similar to FIG. 1D after patterned hard mask layer 103 is removed and one or more conductive layers are deposited into the opening 155 according one embodiment. The patterned hard mask layer 103 can be removed from the insulating layer using one of technique known to one of ordinary skill in the electronic device manufacturing.

In one embodiment, a conductive layer 141 is deposited the top portions of the feature layer 102, on bottom portion 126 and sidewalls of the opening 155. A conductive layer 142 is deposited on conductive layer 141. Examples of the conductive materials that may be used for each of the layers 141 and 142 include, but are not limited to, metals, e.g., copper, tungsten, tantalum, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof. In alternate embodiments, the conductive layer 141 is a seed layer, a barrier layer, an adhesion layer, or any combination thereof. In one embodiment, the thickness of the conductive layer 141 is less than about 200 nm. In one embodiment, the thickness of the conductive layer 141 is from about 1 nm to about 150 nm. Each of the conductive layer 141 and conductive layer 142 can be deposited using one of conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

FIG. 1F is a view 150 similar to FIG. 1E, after portions of the conductive layers 142 and 141 are removed from the top portions of the feature layer 102 to form an interconnect 151 and a device feature 129 is deposited on the top portion of the interconnect 151 according to one embodiment. In alternative embodiments, the device feature 129 can be deposited using one of device feature depositing techniques, e.g., electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing. In one embodiment, device feature 129 is a device contact. In one embodiment, device feature 129 is a part of a conductive line. In alternate embodiments, the device feature 129 is a part of an electronic device, e.g., a transistor, a memory, a capacitor, a switch, a resistor, an inductor, a voltage regulator, an amplifier, a power management integrated circuit, other electronic device, or any combination thereof.

FIG. 1G is a side view 160 of an exemplary embodiment of a wafer according to another embodiment. FIG. 1G is different from FIG. 1A in that a stack of hard mask layers, such as a hard mask layer 162 on a hard mask layer 161 is deposited between a photoresist layer 163 and hard mask layer 104 and substrate 101 is not shown. In one embodiment, the photoresist layer 163 represents photoresist layer 127. The patterned photoresist layer 163 comprises an opening 164 through which to form an opening in hard mask layer 162.

In one embodiment, patterned hard mask layer 162 is used to form opening in hard mask layer 161. Patterned hard mask layer 161 is used to form opening in hard mask layer 104. In one embodiment, each of the hard mask layers 161 and 162 can be one of the hard mask layers known to one of ordinary skill in the art of electronic device manufacturing. In more specific embodiment, hard mask layer 161 is a spin-on-carbon (SOC) layer. Hard mask layer 162 is a silicon based ARC (Si-ARC) layer. Hard mask layer 104 is a DARC layer. Hard mask layer 103 is a Saphira™ hard mask. Feature layer 102 is a dielectric layer.

In one embodiment, the thickness of the photoresist layer 163 is from about 100 nm to about 150 nm. In more specific embodiment, the thickness of the photoresist layer 163 is about 130 nm. In one embodiment, the thickness of the hard mask layer 162 is from about 20 nm to about 50 nm. In more specific embodiment, the thickness of the hard mask layer 162 is about 30 nm. In one embodiment, the thickness of the hard mask layer 161 is from about 130 nm to about 180 nm. In more specific embodiment, the thickness of the hard mask layer 161 is about 160 nm. In one embodiment, the thickness of the hard mask layer 104 is from about 100 nm to about 150 nm. In more specific embodiment, the thickness of the hard mask layer 104 is about 130 nm. In one embodiment, the thickness of the hard mask layer 103 is from about 600 nm to about 1200 nm. In more specific embodiment, the thickness of the hard mask layer 103 is about 900 nm.

The photoresist layer 163 is deposited and patterned on the hard mask layer 162 using one of the photoresist deposition and patterning techniques known to one of ordinary skill in the art of electronic device manufacturing. Each of the hard mask layers 162, 161, 104, and 103 can be deposited using one or more deposition techniques, such as but not limited to a chemical vapour deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

FIG. 1H is a view 170 similar to FIG. 1G after an opening 171 in hard mask layer 103 is formed according to another embodiment. FIG. 1H is different from FIG. 1D in that the patterned hard mask layer 161 is on the patterned hard mask layer 104. In one embodiment, patterned photoresist layer 163 depicted in FIG. 1G is removed by etching hard mask layer 161 and patterned hard mask layer 162 is removed by etching the hard mask layer 104. In one embodiment, patterned hard mask layer 161 is removed by etching the hard mask layer 103. In another embodiment, patterned hard mask layer 161 is removed by etching the feature layer 102.

In one embodiment, opening 171 is formed by etching the hard mask layer 103 through at least the patterned hard mask layer 104 using plasma elements formed from a halogen containing gas at a temperature greater than a room temperature, as described above. In one embodiment, halogen containing gas comprises chlorine and oxygen, as described above.

In one embodiment, the opening 171 is a hole. In another embodiment, the opening 171 is a trench. In one embodiment, the depth of the opening 171 is from about 100 nm to about 1300 nm. In one embodiment, the depth of the opening 171 less than 1300 nm. In more specific embodiment, the depth of the opening 171 is from about 500 nm to about 1000 nm. In one embodiment, the aspect ratio of the opening 171 is greater than 15:1. In another embodiment, the aspect ratio of the opening 171 is at least 40:1. In yet another embodiment, the aspect ratio of the opening 171 is from about 10:1 to about 70:1. As shown in FIG. 1H, opening 171 has a vertical profile so that an angle 175 between sidewall 172 the top surface of the feature layer 102 is about 90 degrees. In one embodiment, opening 171 represents opening 119.

FIG. 2A is a side view of an exemplary embodiment of a wafer 200 to provide a 3D system according to one embodiment. Wafer 200 comprises a patterned hard mask layer 206 on a hard mask layer 205 on a feature layer 220 over a substrate 201. In one embodiment, substrate 201 represents substrate 101. Hard mask layer 205 represents hard mask layer 103.

As shown in FIG. 2A, feature layer 220 comprises a stack of oxide layers 204 and nitride layers 203 deposited on each other. An insulating layer 202 is deposited between substrate 201 and feature layer 220. In one embodiment, insulating layer 202 acts as a barrier layer to prevent electromigration. In one embodiment, insulating layer 202 is an oxide layer, e.g., tantalum oxide (TaO), silicon oxide, aluminum oxide (Al2O3), titanium oxide, or other oxide layer. In one embodiment, the thickness of the insulating layer 202 is from about 5 nm to about 50 nm.

In one embodiment, the oxide layer 204 is a silicon oxide layer. In one embodiment, the nitride layer 203 is a silicon nitride layer. In another embodiment, oxide layer 204 is germanium oxide, gallium oxide, tantalum oxide (TaO), aluminum oxide, titanium oxide, or other oxide layer. In another embodiment, nitride layer 203 is titanium nitride, gallium nitride, tantalum nitride, aluminum nitride, germanium nitride, or other nitride layer. In one embodiment, the thickness of each of the oxide layer 203 and nitride layer 204 is from about 20 nm to about 70 nm. In one embodiment, the stack comprises at least 36 layers of oxide 204 and nitride 203.

The layers 202, 203 and 204 can be deposited using one or more deposition techniques, such as but not limited to a chemical vapour deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

As shown in FIG. 2A, a hard mask layer 206 is deposited on the hard mask layer 205. The hard mask layer 206 is patterned to form openings 207 and 208 down to hard mask layer 205. In one embodiment, hard mask layer 206 represents hard mask layer 104.

In one embodiment, the width of each of the openings 207 and 208 is determined by design. In one embodiment, the width of each of the openings 207 and 208 is in an approximate range from about 2 nm to about 200 nm. In more specific embodiment, the width of each of the openings 207 and 208 is from about 20 nm to about 80 nm. In at least some embodiments, the hard mask layer 206 is etched through the patterned photoresist to form openings 207 and 208 as described above with respect to hard mask layer 104.

As shown in FIG. 2A, the hard mask layer 205 is etched through openings 207 and 208 using a gas to produce plasma elements, such as a plasma element 209 and a plasma element 211 at an elevated temperature 212 that is greater than the room temperature, as described above. In one embodiment, the gas to produce plasma elements to etch hard mask layer 205 contains halogen, such as chlorine ($Cl_2$), fluorine, bromine, iodine, other halogen, or any combination thereof and oxygen ($O_2$), as described above. In one embodiment, plasma element 211 represents an oxygen element, and plasma element 209 represents a halogen element. In another embodiment, the gas to produce plasma elements to etch hard mask layer 205 comprises chlorine, oxygen, and one or more other gases, e.g., argon, nitrogen, helium, other gas, or any combination thereof, as described above.

The halogen and oxygen plasma elements react with dopants and mask material elements to produce volatile by-products and non-volatile products. In one embodiment, the volatile by-products are the dopants coupled to the halogen elements, and mask material elements coupled to the oxygen element, as described above. In one embodiment the non-volatile products to form a passivation layer on sidewalls of the openings in the hard mask layer 205 are the dopants coupled to the oxygen elements and the mask material elements coupled to the halogen elements, as described above. In one embodiment, the volatile by-products comprise boron chloride, boron hydride, boron bromide, boron fluoride, CO, CO2, or any combination thereof.

FIG. 2B is a view 210 similar to FIG. 2A after openings 212 and 213 are formed in the hard mask layer 205 according to one embodiment. In one embodiment, the openings 212 and 213 are formed down to a top nitride layer 203 of feature layer 220 by selectively etching hard mask layer 205 through the patterned hard mask layer 206 using one of the techniques as described above with respect to FIGS. 1B, 1C, 4A, 4B and 5. As shown in FIG. 2B, each of the openings 212 and 213 has opposing sidewalls and a bottom. In one embodiment, the openings 212 and 213 are holes. In one embodiment, each of the openings 212 and 213 represents opening 119.

Figure 2D:
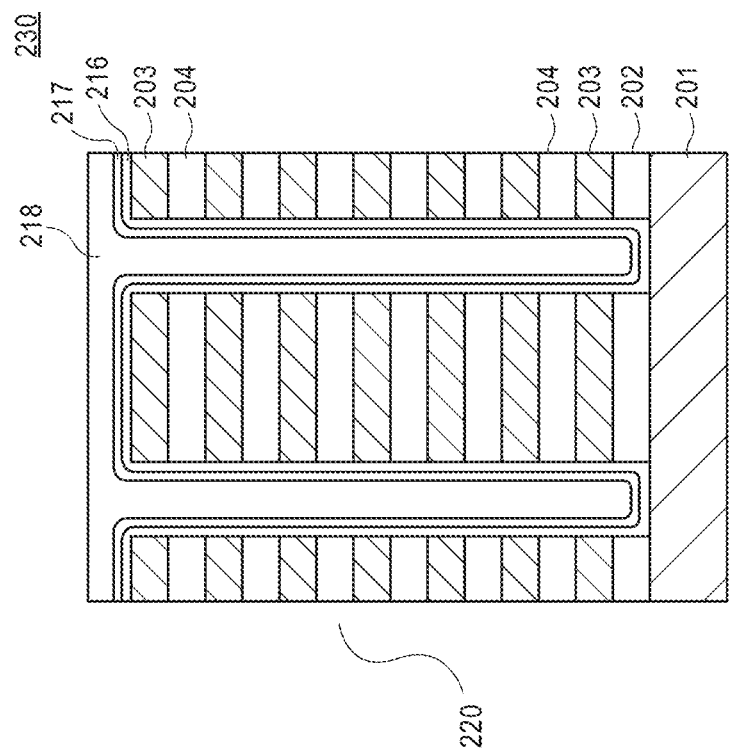
FIG. 2D is a view similar to FIG. 2C after one or more channel hole layers are deposited into the openings according one embodiment.
Figure 2C:
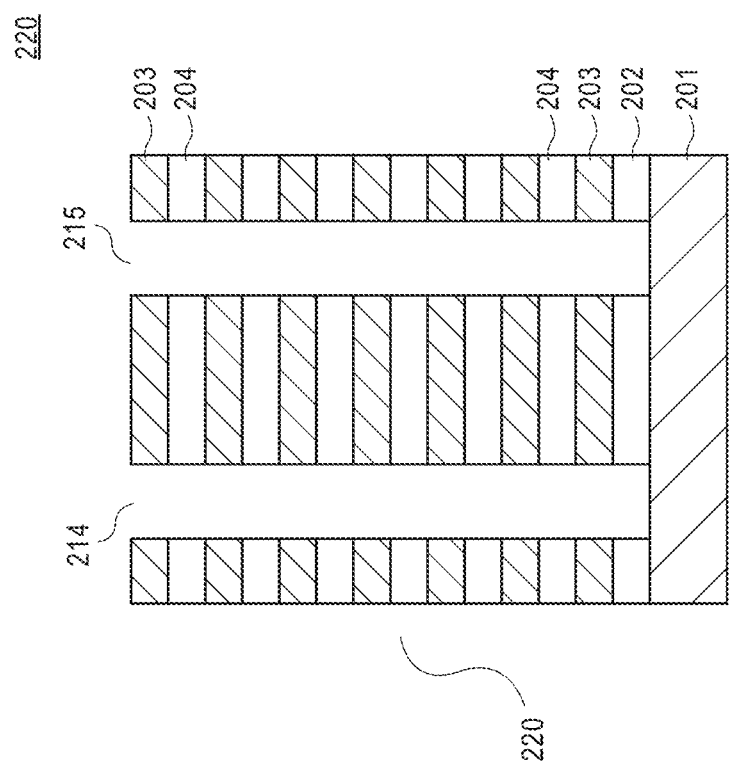
FIG. 2C is a view similar to FIG. 2B after openings are formed in the feature layer and the patterned hard mask layer is removed according to one embodiment.

FIG. 2C is a view 220 similar to FIG. 2B after openings 214 and 215 are formed in the feature layer 220 and patterned hard mask layer 205 is removed according to one embodiment. The openings 214 and 215 are formed in the feature layer 220 through insulating layer 202 down to substrate 201 using the patterned hard mask layer 205 as a mask, as described above with respect to FIG. 1D. The patterned hard mask layer 205 is removed using one of the hard mask layer removal techniques known to one of ordinary skill in the art of electronic device manufacturing.

In one embodiment, each of the openings 214 and 215 is a high aspect ratio channel hole. In one embodiment, the width of each of the openings 214 and 215 is determined by width of the openings 212 and 213. In one embodiment, the width of each of the openings 214 and 215 is from about 20 nm to about 80 nm. In one embodiment, the depth of each of the openings 214 and 215 is from about 0.5 μm to about 10 μm. In one embodiment, the aspect ratio of each of the openings 214 and 215 is greater than 15:1. In another embodiment, the aspect ratio of each of the openings 214 and 215 is greater than 40:1. In yet another embodiment, the aspect ratio of each of the openings 214 and 215 is in the approximate range of 10:1 to 70:1. In one embodiment, the pitch between the openings 214 and 215 is from about 10 nm to about 200 nm. In one embodiment, each of the openings 214 and 215 is formed using one of techniques as described above with respect to FIG. 1D.

FIG. 2D is a view 230 similar to FIG. 2C after one or more channel hole layers are deposited into the openings 214 and 215 according one embodiment. As shown in FIG. 2D, the channel hole layers comprise a dielectric filler layer 218, on a conductive layer 217 on a dielectric layer 216. In one embodiment, a conductive layer 217 acts as a floating gate of a 3D system shown in FIG. 3. As shown in FIG. 2D, dielectric layer 216 is deposited onto the sidewalls and bottoms of the openings 214 and 215 and top portions of the nitride layer 203. In one embodiment, dielectric layer 216 is a nitride layer. In more specific embodiment, dielectric layer is a silicon nitride based dielectric layer. In one embodiment, dielectric layer 216 is deposited to the thickness from about 5 nm to about 20 nm. As shown in FIG. 2D, conductive layer 217 is conformally deposited on dielectric layer 216. In one embodiment, conductive layer 217 is a polysilicon layer. In another embodiment, conductive layer 217 comprises a metal, e.g., copper, tungsten, tantalum, titanium, hafnium, zirconium, aluminum, silver, tin, lead, metal alloys, metal carbides, other conductive materials, or any combination thereof. In one embodiment, the thickness of the conductive layer 217 is from about 5 nm to about 20 nm. A dielectric filler layer 218 is deposited on conductive layer 217. In one embodiment, dielectric filler layer 218 is a silicon oxide filler layer, or other dielectric layer.

Each of the dielectric layer 216 and dielectric filler layer 218 can be deposited using one or more dielectric layer deposition techniques, such as but not limited to a chemical vapour deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

The conductive layer 217 can be deposited using one of conductive layer deposition techniques, such as but not limited to e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

FIG. 2E is a view 240 similar to FIG. 2D after a patterned hard mask layer 246 on a hard mask layer 245 are formed on the top oxide layer 204 of feature layer 220 according to one embodiment. The top portions of the dielectric filler layer 218, conductive layer 217, dielectric layer 216 and the nitride layer 203 are removed using one of chemical-mechanical polishing (CMP) techniques known to one of ordinary skill in the art of electronic device manufacturing. In one embodiment, hard mask layer 246 represents hard mask layer 104. Hard mask layer 245 represents hard mask layer 103.

As shown in FIG. 2E, the hard mask layer 246 is patterned to form an opening 247 down to hard mask layer 245. In one embodiment, opening 247 is a slit having the length substantially greater than the width. In one embodiment, the width of the opening 247 is determined by design. In one embodiment, the width of the opening 247 is from about 2 nm to about 200 nm. In more specific embodiment, the width of the opening 247 is from about 20 nm to about 80 nm. In at least some embodiments, the hard mask layer 246 is etched through the patterned photoresist to form opening 247 as described above with respect to hard mask layer 104.

As shown in FIG. 2E, the hard mask layer 245 is etched through opening 247 using a gas to produce plasma elements, such as a plasma element 249 and a plasma element 248 at an elevated temperature 251 that is greater than the room temperature, as described above. In one embodiment, the gas to produce plasma elements to etch hard mask layer 245 contains halogen, such as chlorine ($Cl_2$), fluorine, bromine, iodine, other halogen, or any combination thereof and oxygen ($O_2$), as described above. In one embodiment, plasma element 248 represents an oxygen element, and plasma element 249 represents a halogen element. In another embodiment, the gas to produce plasma elements to etch hard mask layer 245 comprises chlorine, oxygen, and one or more other gases, e.g., argon, nitrogen, helium, other gas, or any combination thereof, as described above. The halogen and oxygen plasma elements react with dopants and mask material elements to produce volatile by-products and non-volatile products, as described above.

FIG. 2F is a view 250 similar to FIG. 2E after an opening in the feature layer 220 is formed according to one embodiment. First, an opening 252 is formed in hard mask layer 245 down to the top oxide layer 204 of feature layer 220 by selectively etching hard mask layer 245 through the patterned hard mask layer 246 using one of the techniques as described above with respect to FIGS. 1B, 1C, 4A, 4B and 5.

In one embodiment, the opening 252 is a high aspect ratio opening. In one embodiment, the opening 252 is a slit having the length substantially greater than the width. In one embodiment, the opening 252 has the width from about 2 nm to about 200 nm. In more specific embodiment, the opening 252 has the width from about 10 nm to about 80 nm and the length from about 0.5 μm to about 100 μm. In one embodiment, the depth of the opening 252 is from about 0.5 μm to about 10 μm. In one embodiment, the aspect ratio of the opening 252 is greater than 15:1. In another embodiment, the aspect ratio of the opening 252 is greater than 40:1. In yet another embodiment, the aspect ratio of the opening 252 is in the approximate range of 10:1 to 70:1.

Next, the feature layer 220 is etched through opening 252 down through insulating layer 202 to substrate 201 using the patterned hard mask layer 245 as a mask, as described above with respect to FIG. 1D. In one embodiment, the opening in the feature layer 220 is formed using one of techniques as described above with respect to FIG. 1D.

FIG. 2G is a view 260 similar to FIG. 2F after the patterned hard mask layers 246 and 245 and nitride layers 203 are removed, and a common source line region 261 is formed according to one embodiment. The patterned hard mask layers 246 and 245 are removed using one or more hard mask layer removal techniques known to one of ordinary skill in the art of electronic device manufacturing. In alternate embodiments, nitride layers 203 are removed using wet etching, dry etching, or any combination thereof. In one embodiment, nitride layers 203 are removed by wet etching in a hot phosphoric acid ($H_3PO_4$) bath. In one embodiment, the common source line region 261 having the dopant concentration from about $1 \times 10^{19}$ atoms/cm$^3$ to about $1 \times 10^{21}$ atoms/cm$^3$ is formed on substrate 201 through opening 252. The common source line 261 can be formed using one of ion implantation techniques, or other source line forming techniques known to one of ordinary skill in the art of electronic device manufacturing.

FIG. 2H is a view 270 similar to FIG. 2G after conductive layers are formed according to one embodiment. As shown in FIG. 2H, a conductive layer 271 is formed on portions of the oxide layers 204, such as an upper portion 273, a side portion 275 and a bottom portion 276, and exposed portions of the dielectric layer 216, such as a portion 274. In one embodiment, the thickness of the conductive layer 271 is from about 10 angstroms to about 10 nm. A conductive layer 272 is formed on conductive layer 271 between oxide layers 204. As shown in FIG. 2H, conductive layer 272 on conductive layer 271 replace the removed nitride layer 203. In one embodiment, conductive layer 272 on conductive layer 271 act as a part of a control gate of a 3D system depicted in FIG. 3.

In one embodiment, conductive layer 271 is a titanium nitride acting as a barrier layer. In one embodiment, conductive layer 272 is a tungsten layer. In alternative embodiments, each of the conductive layers 272 and 271 comprises a metal, e.g., copper, tungsten, tantalum, titanium, hafnium, zirconium, aluminum, silver, tin, lead, metal alloys, metal carbides, other conductive materials, or any combination thereof. Each of the conductive layer 271 and conductive layer 272 can be deposited using one of conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing. As shown in FIG. 2H, conductive layer 272 is removed from opening 252. In one embodiment, conductive layer 272 is removed from opening 252 by etching using one of etching techniques, such as a wet etching, dry etching, or both techniques known to one of ordinary skill in the electronic device manufacturing.

FIG. 2I is a view 280 similar to FIG. 2H after one or more dielectric layers are deposited into the opening 252 according one embodiment.

A dielectric layer 281 is deposited through opening 252 onto common source line region 261, as shown in FIG. 2I. In one embodiment, dielectric layer 281 acts as a field insulating layer between word lines of a 3D transistor system depicted in FIG. 3.

In one embodiment, dielectric layer 281 is an oxide layer e.g., silicon oxide (SiO), silicon dioxide ($SiO_2$), aluminum oxide, any other oxide dielectric layer, or any combination thereof. In another embodiment, dielectric layer 281 is a nitride layer, e.g., silicon oxide nitride, a silicon nitride, other electrically insulating layer determined by an electronic device design, or any combination thereof. Dielectric layer 281 can be deposited using one or more dielectric layer deposition techniques, such as but not limited to a chemical vapour deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing. The dielectric layer 281 is removed from the top portions of the oxide layer 204 and top portions of the dielectric filler layer 218, conductive layer 217 and dielectric layer 216 using one of chemical-mechanical polishing (CMP) techniques known to one of ordinary skill in the art of electronic device manufacturing.

Figure 10:
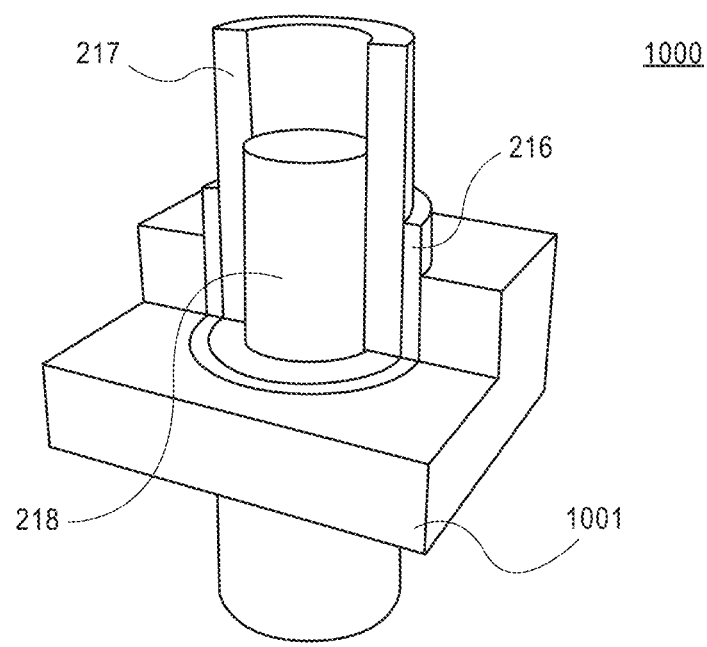
FIG. 10 shows a perspective view of a portion of a 3D transistor comprising the channel hole layers as depicted in FIG. 2D according to one embodiment.

FIG. 10 shows a perspective view 1000 of a portion of a 3D transistor comprising the channel hole layers as depicted in FIG. 2D according to one embodiment. Dielectric filler 218 is a column extending through an opening 1002 in a gate electrode 1001. Conductive layer 217 wraps around the dielectric filler 218. In one embodiment, conductive layer 217 acts as a floating gate. Dielectric layer 216 wraps around the conductive layer 217. A gate electrode 1001 wraps around the dielectric layer 216. In one embodiment, gate electrode 1001 comprises conductive layer 272 on conductive layer 271.

Figure 3:
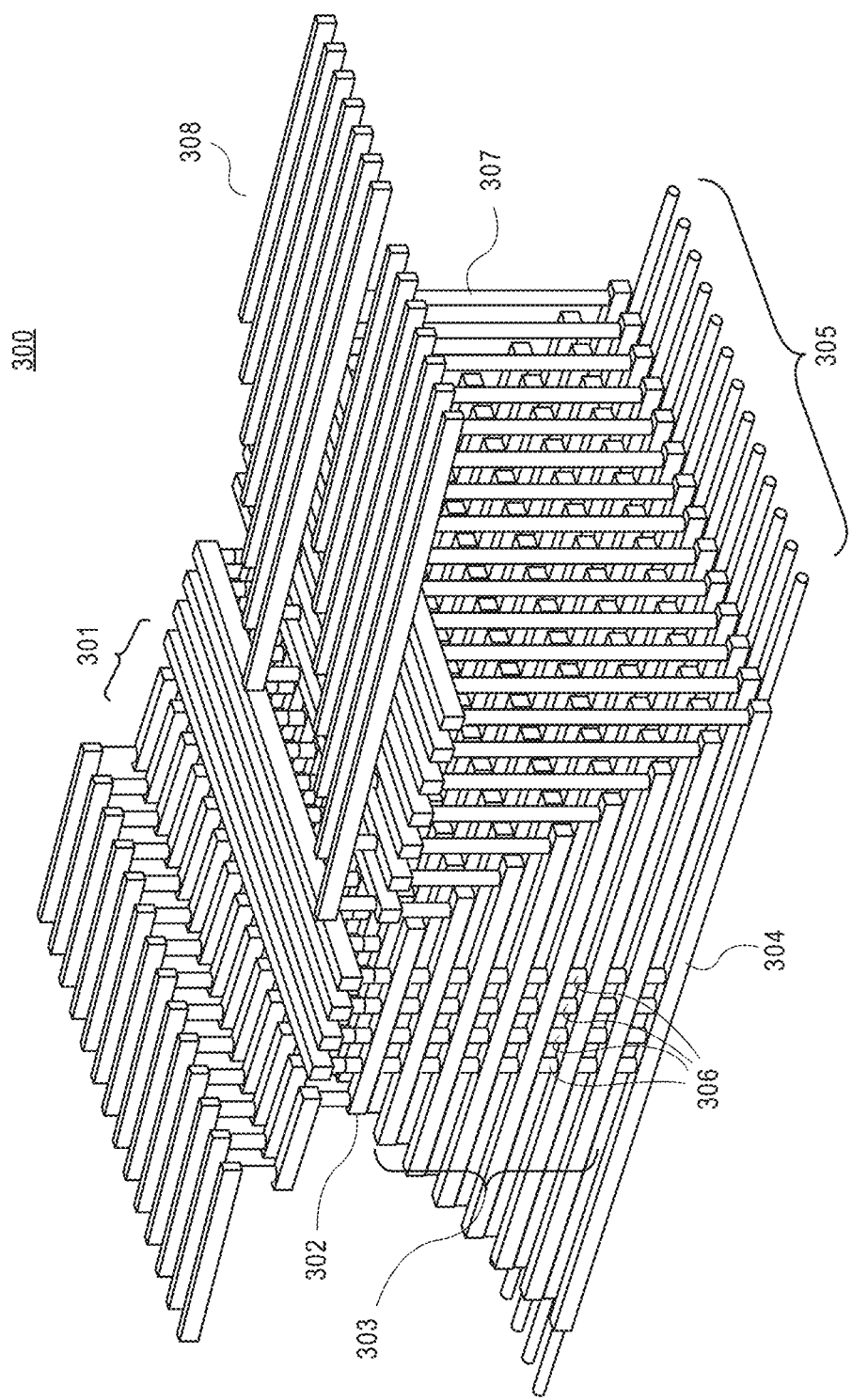
FIG. 3 is a view of a 3D transistor system manufactured using methods described with respect to FIGS. 2A-2H according to one embodiment.

FIG. 3 is a view of a 3D transistor system 300 manufactured using methods described with respect to FIGS. 2A-2H according to one embodiment. System 300 comprises bit lines (BL) 301 coupled to a string select line (SSL) 302, control gate word lines (WL) 303, a ground select line (GSL) 304, and common source lines (CSL) 305. In one embodiment, word lines 303 are coupled to the floating gates formed as a part of channel hole structures 306 described above with respect to FIGS. 2A-2D and FIG. 10. In one embodiment, word lines 305 are separated by an insulating layer formed in the slit as described above with respect to FIGS. 2E-2I. As shown in FIG. 3, a plurality of HAR interconnects 307 are formed to contact to BLs 301, SSL 302, WLs 303, GSL 304, CSL 305. HAR interconnects are connected to contact lines 308. In one embodiment, HAR interconnects 307 are formed using methods, as described above with respect to FIGS. 1A-1H.

Figure 6:
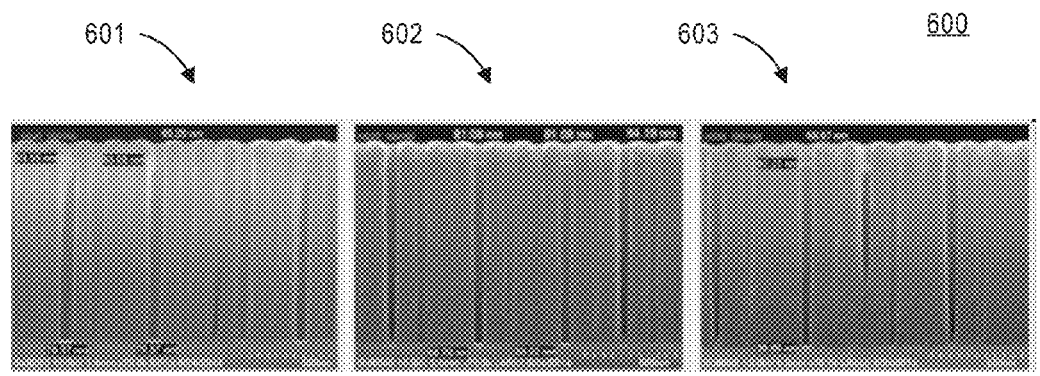
FIG. 6 is a view of images illustrating tuning a profile of HAR openings in a hard mask according to one embodiment.

FIG. 6 is a view 600 of images illustrating tuning a profile of HAR openings in the Saphira™ mask according to one embodiment. Image 601 shows the HAR openings having a substantially vertical profile. As shown in image 601, the bottom to top ratio of the opening is greater than 80%, bottom CD is about 80 nm, the angle between the sidewall and the bottom of the opening is about 90 degrees. Image 602 shows the HAR openings having an intermediately tapered profile. As shown in image 602, the bottom to top ratio of the opening is between about 70% to about 80%, bottom CD is about 60 nm, the angle between the sidewall and the bottom of the opening is between about 88 degrees and about 89.4 degrees. Image 603 shows the HAR openings having substantially tapered profile. As shown in image 603, the bottom to top ratio of the opening is less than 50%, bottom CD is about 40 nm, the angle between the sidewalls and the bottom of the opening is between less than 89 degrees. The profile of the openings shown in images 601, 602, and 603 was tuned by adjusting one or more parameters comprising the elevated temperature, a gas flow rate, a bias power, a pressure, a source power, time, or any combination thereof, as described above.

Figure 7:
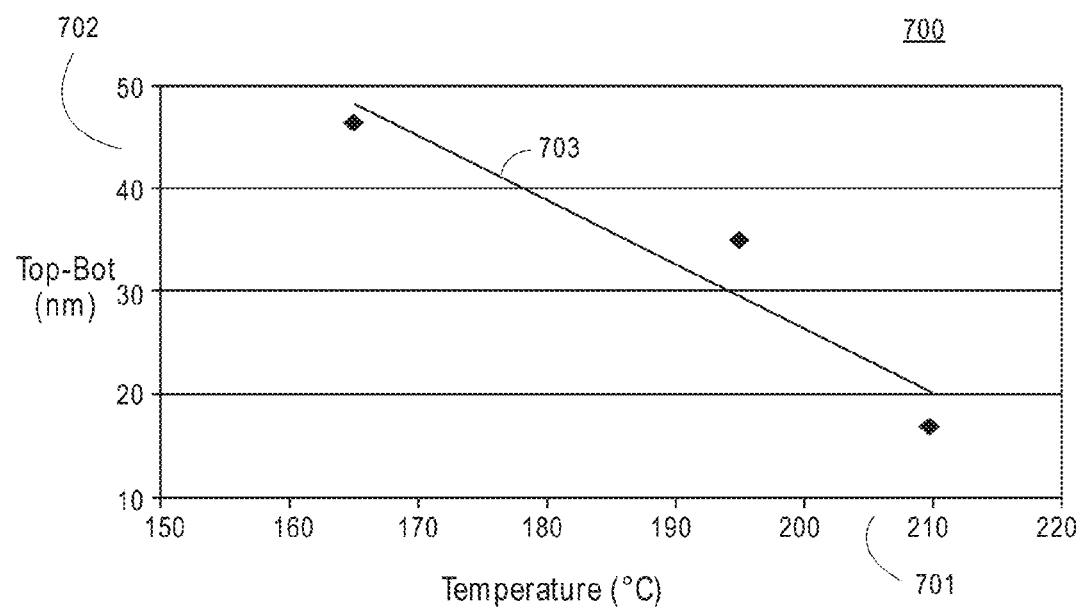
FIG. 7 is a view of a graph showing a difference between the size of the opening in a hard mask at the top and at the bottom versus an etching temperature according to one embodiment.

FIG. 7 is a view of a graph 700 showing a difference between the size of the opening in the hard mask at the top and at the bottom 702 versus an etching temperature 701 according to one embodiment. In one embodiment, the hard mask is doped with boron. In one embodiment, the hard mask comprises carbon and boron. In one embodiment, the hard mask is a Saphira™ hard mask. A curve 703 shows that as the temperature 701 increases, the difference 702 decreases. In one embodiment, as the etching temperature increases, the lateral etching rate increases. In one embodiment, increasing the boron concentration in the mask increases the temperature at which the substantially vertical profile is produced.

Figure 8:
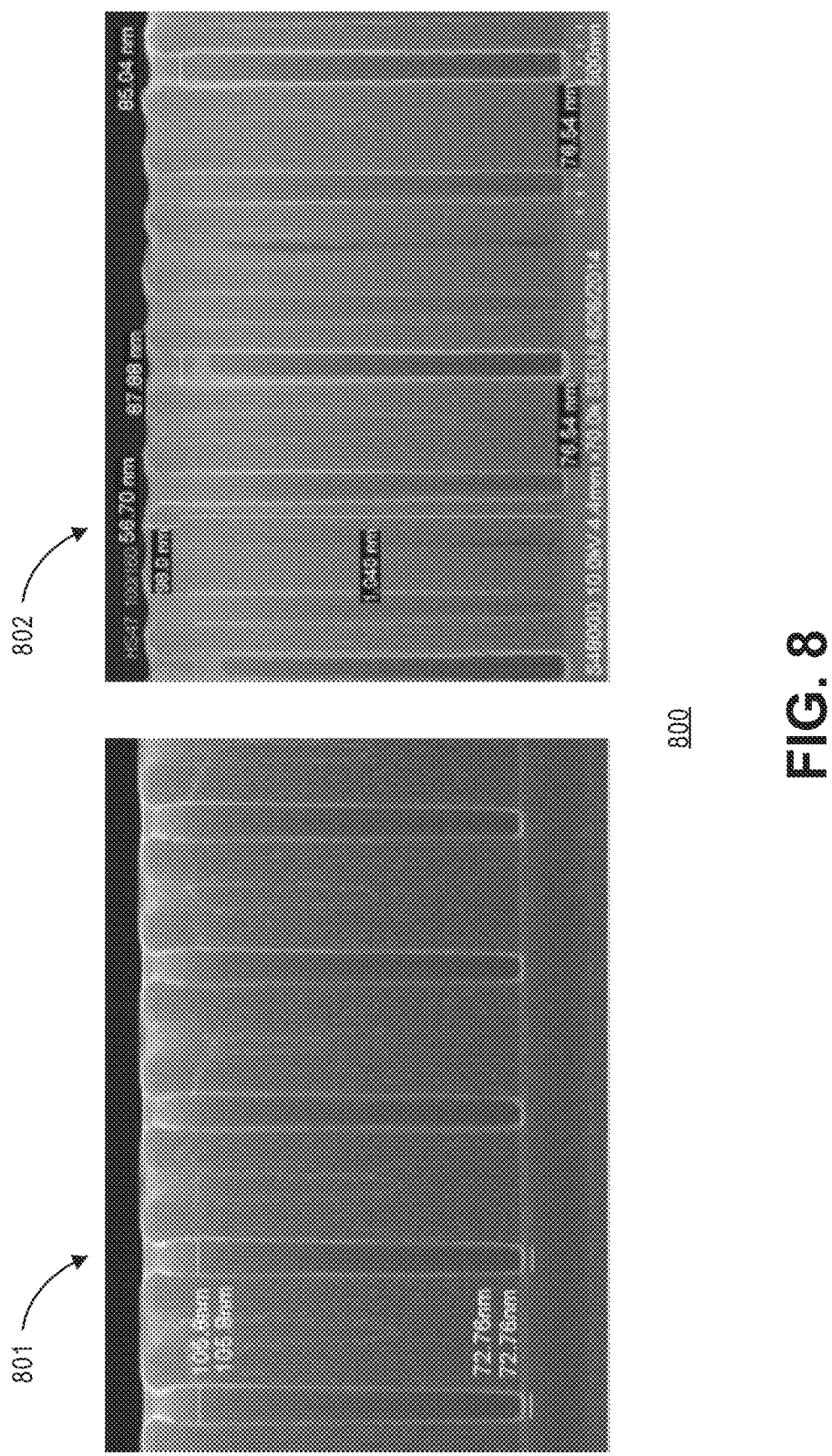
FIG. 8 is a view showing an image depicting hard mask HAR openings according to one embodiment in comparison with an image depicting conventional hard mask HAR openings.

FIG. 8 is a view 800 showing an image 802 depicting hard mask HAR openings according to one embodiment in comparison with an image 801 depicting conventional hard mask HAR openings. The bottom to top CD ratio of the HAR openings shown in image 802 is significantly greater than the bottom to top CD ratio of the HAR openings shown in image 801. In one embodiment, the etching rate to form the HAR openings shown in image 802 is at least twice greater than the etching rate to form the HAR openings shown in image 801.

FIG. 9 shows a block diagram of one embodiment of a plasma system 900 to provide mask etch according to one embodiment. As shown in FIG. 9, system 900 has a processing chamber 901. A movable pedestal 902 to hold a workpiece 903 is placed in processing chamber 901. Pedestal 902 comprises an electrostatic chuck ("ESC"), a DC electrode embedded into the ESC, and a cooling/heating base. In an embodiment, pedestal 902 acts as a moving cathode. In an embodiment, the ESC comprises an $Al_2O_3$ material, $Y_2O_3$, or other ceramic materials known to one of ordinary skill of electronic device manufacturing. A DC power supply 904 is connected to the DC electrode of the pedestal 902.

As shown in FIG. 9, a wafer 903 is loaded through an opening 908 and placed on the pedestal 902. The wafer 903 represents one of the wafers described above. System 900 comprises an inlet to input one or more process gases 912 through a mass flow controller 911 to a plasma source 913. A plasma source 913 comprising a showerhead 914 is coupled to the processing chamber 901 to receive one or more gases 912 to generate plasma elements (particles), as described above. Plasma source 913 is coupled to a RF source power 910. Plasma source 913 through showerhead 914 generates plasma 915 in processing chamber 901 from one or more process gases 912 using a high frequency electric field. Plasma 915 comprises plasma particles, such as ions, electrons, radicals, or any combination thereof, as described above. In an embodiment, power source 910 supplies power from about 100 W to about 3000 W at a frequency from about 13.56 MHz to about 162 MHz to generate plasma 915.

A plasma bias power 905 is coupled to the pedestal 902 (e.g., cathode) via a RF match 907 to energize the plasma. In an embodiment, the plasma bias power 905 provides a bias power at a predetermined frequency. A plasma bias power 906 may also be provided, for example to provide another bias power at a predetermined frequency. Plasma bias power 906 and bias power 905 are connected to RF match 907 to provide a dual frequency bias power. In an embodiment, a total bias power applied to the pedestal 902 is from about 10 W to about 3000 W.

As shown in FIG. 9, a pressure control system 909 provides a pressure to processing chamber 901. As shown in FIG. 9, chamber 901 has one or more exhaust outlets 916 to evacuate volatile products produced during processing in the chamber. In an embodiment, the plasma system 900 is an ICP system. In an embodiment, the plasma system 900 is a CCP system.

A control system 917 is coupled to the chamber 901. The control system 917 comprises a processor 918, a temperature controller 919 coupled to the processor 918, a memory 920 coupled to the processor 918, and input/output devices 921 coupled to the processor 918 to control performing methods as described herein.

The plasma system 900 may be any type of high performance semiconductor processing plasma systems known in the art, such as but not limited to an etcher, a cleaner, a furnace, or any other plasma system to manufacture electronic devices. In an embodiment, the system 900 may represent one of the plasma systems e.g., Producer, Centura, Mesa or Capa plasma systems manufactured by Applied Materials, Inc. located in Santa Clara, Calif., or any other plasma system.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A method to manufacture an electronic device, comprising:
    depositing a first hard mask layer on a feature layer over a substrate, the first hard mask layer comprising an organic mask layer;
    forming an opening in the first hard mask layer using a first plasma comprising a halogen element and an oxygen element at a first temperature greater than a room temperature to expose a portion of the feature layer, the opening having a profile and a critical diameter, wherein forming the opening includes a first etching operation, a second etching operation and a third etching operation
    to maintain the profile, the critical diameter, or the profile and the critical diameter of the opening, wherein a gas flow rate to provide the oxygen element at the first etching operation is greater than the gas flow rate to provide the oxygen element at the second etching operation that is greater than the gas flow rate to provide the oxygen element at the third etching operation; and
    increasing the first temperature to tune at least one of the profile and the critical diameter.

2. The method of claim 1, wherein the organic mask layer comprises a dopant.

3. The method of claim 1, further comprising
    depositing a second hard mask layer on the first hard mask layer; and
    forming an opening in the second hard mask layer using a second plasma.

4. The method of claim 1, wherein the feature layer comprises one or more insulating layers, one or more conductive layers, one or more semiconductor layers, or any combination thereof.

5. The method of claim 1, further comprising
    adjusting one or more parameters to control the profile of the opening, the critical diameter of the opening, or the profile and the critical diameter of the opening, the one or more parameters comprising a gas flow rate, a bias power, a pressure, a source power, time, or any combination thereof.

6. The method of claim 1, further comprising
    forming a passivation layer on a sidewall of the opening using the first plasma.

7. A method to manufacture an electronic device comprising:
    supplying a first gas to a chamber, the first gas to provide a first plasma comprising a halogen element and an oxygen element;
    etching an organic mask layer comprising a dopant on an insulating layer over a substrate using the halogen element and the oxygen element at a first temperature to form an opening to expose a portion of the insulating layer, the opening having a profile and a critical diameter, wherein etching the organic mask layer includes a first etching operation, a second etching operation and a third etching operation to maintain the profile, the critical diameter, or the profile and the critical diameter, wherein a flow rate of the first gas to provide the oxygen element at the first etching operation is greater than the flow rate of the first gas to provide the oxygen element at the second etching operation that is greater than the flow rate of the first gas to provide the oxygen element at the third etching operation; and increasing the first temperature to tune at least one of the profile and the critical diameter, wherein the first temperature is greater than a room temperature.

8. The method of claim 7 and wherein etching of the organic mask layer comprises removing a second gas comprising the dopant coupled to the halogen element.

9. The method of claim 7, wherein the insulating layer comprises an oxide layer, a nitride layer, or any combination thereof.

10. The method of claim 7, further comprising
supplying a second gas to provide a second plasma to the chamber; and
etching an antireflective coating layer on the organic mask layer using the second plasma at a second temperature lower than the first temperature.

11. The method of claim 7, further comprising
forming a passivation layer on a sidewall of the opening using the first plasma.

12. The method of claim 7, further comprising
supplying a third gas to provide a third plasma into the chamber; and
etching the exposed portion of the insulating layer using the third plasma.

* * * * *